(12) United States Patent
Lazzari

(10) Patent No.: US 11,692,727 B2
(45) Date of Patent: Jul. 4, 2023

(54) COOLING SYSTEM WITH REDUCED PRESSURE DROP

(71) Applicant: UNIFLAIR S.p.A., Conselve (IT)

(72) Inventor: Matteo Lazzari, Nanto (IT)

(73) Assignee: UNIFLAIR S.p.A., Conselve (IT)

( * ) Notice: Subject to any disclaimer, the term of this patent is extended or adjusted under 35 U.S.C. 154(b) by 223 days.

(21) Appl. No.: 15/889,935

(22) Filed: Feb. 6, 2018

(65) Prior Publication Data

US 2018/0224149 A1    Aug. 9, 2018

(30) Foreign Application Priority Data

Feb. 7, 2017   (IT) .......................... 102017000013362

(51) Int. Cl.
*F24F 11/46* (2018.01)
*F25D 16/00* (2006.01)
(Continued)

(52) U.S. Cl.
CPC ............ *F24F 11/46* (2018.01); *F24F 1/0063* (2019.02); *F24F 1/00073* (2019.02); *F24F 1/00077* (2019.02); *F24F 3/044* (2013.01); *F24F 5/001* (2013.01); *F24F 5/0003* (2013.01); *F24F 5/0035* (2013.01); *F24F 11/83* (2018.01); *F24F 12/002* (2013.01); *F25B 25/005* (2013.01); *F25D 16/00* (2013.01); *H05K 7/2079* (2013.01); *H05K 7/20827* (2013.01);
(Continued)

(58) Field of Classification Search
CPC .. H05K 7/2079; H05K 7/20827; H05K 7/202; H05K 7/20209; H05K 7/20254; F24F 11/46; F24F 3/044; F24F 12/002; F24F 2011/0002

USPC ........................................................ 165/140
See application file for complete search history.

(56) References Cited

U.S. PATENT DOCUMENTS 1,538,857 A * 5/1925 Light ...................... F23K 5/20
                                                       165/140
1,701,341 A * 2/1929 Small ..................... F25B 39/04
                                                       165/140
(Continued)

OTHER PUBLICATIONS

Italian Search Report and Written Opinion from corresponding Italian Application No. 102017000013362 dated Oct. 5, 2017.
(Continued)

*Primary Examiner* — Devon Russell
(74) *Attorney, Agent, or Firm* — Lando & Anastasi, LLP

(57) ABSTRACT

A cooling system includes a cooling device having a first cooling coil and a second cooling coil, a first heat transfer fluid in fluid communication with the first cooling coil, a second heat transfer fluid in fluid communication with the second cooling coil, a first heat exchanger in fluid communication with the first heat transfer fluid and the second heat transfer fluid, a second heat exchanger in fluid communication with the second heat transfer fluid and a source of external air, a system of fluid control devices in fluid communication with the second heat transfer fluid and configured to minimize a change in a total pressure drop of the second heat transfer fluid when the cooling system switches between operating modes, and a controller configured to selectively control the cooling device and the system of fluid control devices to operate the cooling system in each of the operating modes.

17 Claims, 17 Drawing Sheets

(51) Int. Cl.
*F25B 25/00* (2006.01)
*F24F 11/83* (2018.01)
*F24F 5/00* (2006.01)
*H05K 7/20* (2006.01)
*F24F 1/0007* (2019.01)
*F24F 1/0063* (2019.01)
*F24F 3/044* (2006.01)
*F24F 12/00* (2006.01)
*F24F 11/30* (2018.01)
*F24F 110/12* (2018.01)
*F24F 11/00* (2018.01)

(52) U.S. Cl.
CPC ....... *F24F 11/30* (2018.01); *F24F 2005/0039* (2013.01); *F24F 2011/0002* (2013.01); *F24F 2011/0006* (2013.01); *F24F 2012/007* (2013.01); *F24F 2012/008* (2013.01); *F24F 2110/12* (2018.01); *Y02B 30/54* (2013.01)

(56) References Cited

U.S. PATENT DOCUMENTS

| | | | | |
|---|---|---|---|---|
| 1,710,712 A * | 4/1929 | Reavis | ...... | F28B 1/00 165/140 |
| 1,908,733 A * | 5/1933 | Creel | ...... | F28B 1/00 165/101 |
| 1,919,606 A * | 7/1933 | Temkovits | ...... | F28D 3/02 165/68 |
| 2,089,630 A * | 8/1937 | Teeter | ...... | F25B 31/00 137/513.3 |
| 2,091,755 A * | 8/1937 | Fleshman | ...... | F25D 31/002 165/145 |
| 2,119,864 A * | 6/1938 | Kleucker | ...... | F25D 31/002 62/394 |
| 2,916,936 A * | 12/1959 | Neracher | ...... | B60W 10/02 477/124 |
| 3,884,095 A * | 5/1975 | Miyao | ...... | F16H 47/04 475/82 |
| 4,567,733 A | 2/1986 | Mecozzi | | |
| 4,595,343 A * | 6/1986 | Thompson | ...... | E21B 21/08 175/217 |
| 4,996,950 A * | 3/1991 | Le Mer | ...... | F24H 1/48 122/260 |
| 9,179,574 B2 | 11/2015 | Canney et al. | | |
| 2001/0042380 A1* | 11/2001 | Cho | ...... | F25B 41/00 62/238.2 |
| 2002/0184905 A1* | 12/2002 | Benedict | ...... | F25B 1/053 62/228.4 |
| 2003/0033165 A1* | 2/2003 | Inoue | ...... | G06Q 40/00 705/35 |
| 2005/0150410 A1* | 7/2005 | Haas | ...... | B41F 13/22 101/480 |
| 2009/0318064 A1* | 12/2009 | Hashish | ...... | B24C 5/02 451/36 |
| 2010/0036531 A1* | 2/2010 | Chessel | ...... | F25B 25/00 700/275 |
| 2010/0107658 A1 | 5/2010 | Cockrell | | |
| 2012/0297807 A1 | 11/2012 | Canney et al. | | |
| 2013/0199627 A1* | 8/2013 | Gilbert | ...... | E03C 1/0408 137/334 |
| 2014/0060105 A1* | 3/2014 | Azuma | ...... | F24F 11/70 62/324.1 |
| 2014/0159267 A1* | 6/2014 | Murch | ...... | B29C 35/007 264/40.6 |
| 2014/0260376 A1* | 9/2014 | Kopko | ...... | F25D 3/005 62/99 |
| 2014/0260391 A1* | 9/2014 | Kopko | ...... | F25B 25/005 62/238.6 |
| 2014/0262305 A1* | 9/2014 | Duman | ...... | E21B 34/06 166/335 |
| 2016/0061508 A1* | 3/2016 | Lowrimore | ...... | F24H 9/20 62/160 |
| 2019/0186801 A1* | 6/2019 | Kopko | ...... | F25B 49/027 |

OTHER PUBLICATIONS

Extended European Search Report from corresponding European Application No. 18152183.2 dated Jul. 5, 2018.

\* cited by examiner

COOLING SYSTEM WITH REDUCED PRESSURE DROP

CROSS-REFERENCE TO RELATED APPLICATION

This application claims the benefit under 35 U.S.C. § 119 of Italian Patent Application No. 102017000013362 filed on Feb. 7, 2017 which is hereby incorporated herein by reference in its entirety for all purposes.

BACKGROUND

Technical Field

The technical field relates generally to cooling systems, and more particularly, to cooling systems that combine different techniques for heat removal.

Background Discussion

Economical systems for heat removal may combine different methods for transporting heat away from an indoor space, such as a computer room or data center. For instance, heat exchange between indoor and outdoor spaces can be facilitated using different transport fluids and cooling devices.

One example of a method for heat removal combines a computer room air handler (CRAH) with a chiller, and is typically referred to as a chilled water system. In this type of system the refrigeration cycle components are located in a device called a water chiller that is positioned external to the IT environment. The function of the chiller is to produce chilled water that is pumped in pipes from the chiller to the CRAH units located in the IT environment. CRAH devices remove heat by drawing warm air from the computer room through chilled water coils filled with circulating chilled water. Heat removed from the IT environment flows out with the (now warmer) chilled water exiting the CRAH and returning to the chiller. The chiller then removes the heat from the warmer chilled water and transfers it to another stream of circulating water called condensing water which flows through a cooling tower that is also positioned external to the IT environment.

Another example of a method for heat removal combines an air-cooled computer room air conditioner (CRAC) with a condenser, and is typically referred to as an air-cooled CRAC DX system. The "DX" designation stands for direct expansion and refers to any system that uses refrigerant and an evaporator coil to create a cooling effect. The refrigerant may be a chlorinated fluorocarbon or halogenated chlorofluorocarbon or ammonia. Air-cooled CRAC units can be used in IT environments and are typically configured such that half the components of the refrigeration cycle are in the CRAC and the rest are outdoors in the air-cooled condenser. Heat from the IT environment is "pumped" to the outdoor environment using a circulating flow of refrigerant. A compressor may reside in the CRAC unit or in the condenser.

Free cooling refers to cooling techniques in which low external air temperatures are used to assist in cooling operations. Airside free cooling introduces cold outside air directly into the IT room or data center when atmospheric conditions allow. Waterside free cooling uses an additional cooling coil containing glycol that circulates directly from the fluid cooler when atmospheric conditions allow. Free cooling methods may be either direct or indirect. Direct free cooling refers to a cooling technique where air sourced from an external environment, such as the outdoors, is mixed directly with hot air sourced from an internal environment, such as a room in a building. In contrast, indirect free cooling refers to a cooling technique where air sourced from an external environment is mixed indirectly with hot air sourced from an internal environment. One example of indirect free cooling combines an air duct with an indirect air evaporative cooler. This system uses outdoor air as the heat transport fluid to indirectly cool data center air when the temperature outside is lower than a temperature set point of the IT environment inlet air. Fans blow cold outside air through an air-to-air heat exchanger, which in turn cools the hot data center air on the other side of the heat exchanger, thereby completely isolating the data center air from the outside air.

One or more heat removal methods may be used to cool a computer room or data center environment. The primary differentiator between methods of heat removal may reside in the way each collects and transports heat to the outside atmosphere. When combined, these differences can sometimes lead to one or more mechanical problems, as well as increased energy consumption.

SUMMARY

Aspects and embodiments are directed to reducing mechanical problems and power consumption in a cooling module for a data center.

According to various aspects and embodiments, a cooling system is provided. The cooling system includes a cooling device including a first cooling coil and a second cooling coil, a first heat transfer fluid in fluid communication with the first cooling coil, a second heat transfer fluid in fluid communication with the second cooling coil, a first heat exchanger in fluid communication with the first heat transfer fluid and the second heat transfer fluid, a second heat exchanger in fluid communication with the second heat transfer fluid and a source of external air, a system of fluid control devices in fluid communication with the second heat transfer fluid and configured to minimize a change in a total pressure drop of the second heat transfer fluid when the cooling system switches between operating modes, and a controller configured to selectively control the cooling device and the system of fluid control devices to operate the cooling system in each of the operating modes.

According to another embodiment, the system of fluid control devices includes a first valve positioned between an outlet of the second heat exchanger and an inlet of the first heat exchanger. According to one embodiment, the first valve is a proportional control valve. According to another embodiment, the first valve is configured to be modulated over a total valve position range from a full closed position to a full open position. According to some embodiments, the first valve is a modulating motor-controlled valve.

According to another embodiment, the system of fluid control devices further comprises a second valve positioned between the outlet of the second cooling coil and the inlet of the first heat exchanger. According to one embodiment, the second valve is configured with floating control. According to some embodiments, the second valve is configured to modulate a flow of the second heat transfer fluid in incremental steps of a predetermined amount. According to another embodiment, the second valve is an incremental motor-controlled valve.

According to another embodiment, the system of fluid control devices further includes a third valve positioned between an outlet of the first valve and an inlet to the second heat exchanger, and between an outlet of the second valve and the inlet to the second heat exchanger. According to one embodiment, the third valve may be configured an on/off control valve.

In accordance with certain embodiments, the controller is configured to operate the cooling system in a first operating mode by directing the first heat transfer fluid through the first cooling coil and the first heat exchanger, and directing the second heat transfer fluid through the first valve, the first heat exchanger, and the second heat exchanger. In one embodiment, the controller is configured to operate the cooling system in a second operating mode by directing the first heat transfer fluid through the first cooling coil and the first heat exchanger, and directing the second heat transfer fluid through the second cooling coil, the second valve, the first heat exchanger, and the second heat exchanger. According to one embodiment, the inlet of the first heat exchanger is a first inlet, the cooling system further includes a compressor in fluid communication with the first heat transfer fluid and positioned in between an outlet of the first cooling coil and a second inlet of the first heat exchanger, wherein the controller is configured to reduce a cooling capacity of the compressor and the first cooling coil in the second operating mode such that a temperature of the first heat transfer fluid entering the second inlet in the second operating mode is lower than a temperature of the first heat transfer fluid entering the second inlet in the first operating mode.

According to another embodiment, the controller is configured to operate the cooling system in a third operating mode by directing the second heat transfer fluid through the second cooling coil, the third valve, and the second heat exchanger, and modulating the flow of the second heat transfer fluid through the first valve and the second valve. According to one embodiment, modulating the flow of the second heat transfer fluid comprises opening the first valve for a predetermined time while closing the second valve by a predetermined amount. According to another embodiment, modulating the flow of the second heat transfer fluid comprises closing the first valve for a predetermined time while opening the second valve by a predetermined amount.

According to one embodiment, the cooling system further includes at least one temperature sensor in communication with the controller, and the controller is further configured to determine an operating mode based at least in part on an input signal from the at least one temperature sensor. According to some embodiments, the first heat exchanger is a condenser. According to another embodiment, the second heat exchanger is a dry cooler. According to certain embodiments, the first heat transfer fluid is a refrigerant and the second heat transfer fluid is at least one of glycol and water.

According to some embodiments, the system of fluid control devices is configured to provide a substantially constant flow rate of the second heat transfer fluid when the cooling system switches between operating modes.

In accordance with another embodiment, a method for controlling a cooling system is provided. The cooling system may have a direct expansion (DX) cooling device and a free cooling device and be configured to cool a source of internal air, and the method may include receiving a set point temperature for a source of internal air, measuring a temperature of a heat transfer fluid and a temperature of the source of internal air, determining an operating mode based on the received set point temperature, the measured temperature of the heat transfer fluid, and the measured temperature of the source of internal air, and responsive to the determined operating mode, selectively directing the heat transfer fluid through a system of fluid control devices in each operating mode such that a flow rate of the heat transfer fluid is substantially constant in all operating modes, each operating mode comprising operating a first heat exchanger in fluid communication with the heat transfer fluid and a source or external air, and at least one of the DX cooling device and the free cooling device.

According to one embodiment, responsive to determining a first operating mode, the method may include directing the heat transfer fluid through a first valve of the system of fluid control devices, the first heat exchanger, and a second heat exchanger in fluid communication with a refrigerant.

According to another embodiment, responsive to determining a second operating mode, the method may include bypassing the first valve and directing the heat transfer fluid through a cooling coil of the free cooling device, a second valve of the system of fluid control devices, the first heat exchanger, and the second heat exchanger.

According to another embodiment, responsive to determining a third operating mode, the method may include bypassing the second heat exchanger and directing the heat transfer fluid through the cooling coil, a third valve of the system of fluid control devices and the second heat exchanger, and modulating the flow of the heat transfer fluid through the first and the second valves.

In accordance with some embodiments, modulating the flow of the heat transfer fluid includes one of opening the first valve for a predetermined time while closing the second valve by a predetermined amount and closing the first valve for a predetermined time while opening the second valve by a predetermined amount.

According to one embodiment, the first valve is configured with a flow regulating device and modulating the flow of the heat transfer fluid includes modulating the position of the flow regulating device over a total valve position range from a full closed position to a full open position.

According to one embodiment, the second valve is configured to be partially opened or closed in uniform increments. According to another embodiment, the second valve is configured to be partially opened or closed based on the position of the first valve.

According to certain embodiments, modulating the flow of the heat transfer fluid is based on the measured temperature of the source of internal air.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1A:
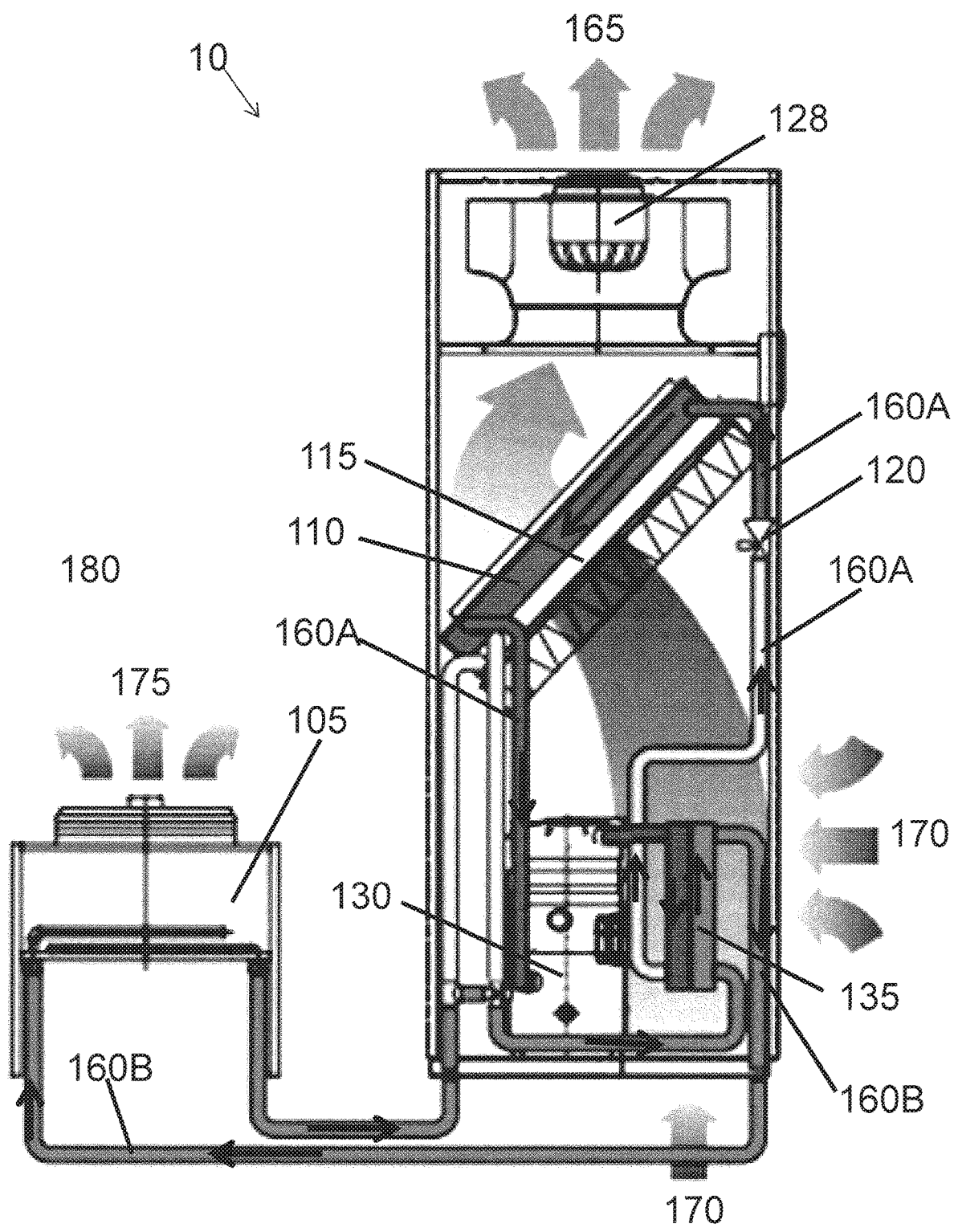
FIG. 1A is a schematic diagram of a cooling system operating in a first mode in accordance with one or more aspects of the invention.

Cooling systems for removing heat in conditioned spaces such as IT environments use heat transport fluids such as air, water, or refrigerant to transport heat energy from indoors to outdoors. Many cooling systems rely on the refrigeration cycle as the primary means of cooling. Pumped refrigerant systems provide isolation between the primary heat removal system and IT equipment. The direct air and indirect air methods rely on the outdoor conditions as the primary means of cooling, which makes them more efficient for mild climates.

Although the examples discussed herein refer to an IT environment, the methods and system discussed in this disclosure may be applied to any confined space (also referred to herein as a "conditioned space"), such as a room, inside a building or other structure that contains air to be cooled. For example, the space to be cooled may be one or more rooms in a public or private building, such as a private residence, office space, or other commercial or municipal space, or may include spaces within an industrial or manufacturing complex. Furthermore, more than one cooling device (such as the DX evaporator and CW coil discussed below) may be used for cooling.

In some embodiments, the space being cooled is a data center or IT environment. A data center may include one or more rooms or spaces that contain rows of equipment racks designed to house electronic equipment, such as data processing, networking, and telecommunications equipment. During operation the electronic equipment generates heat that needs to be removed to ensure the continued performance, reliability, and useful life of the equipment components housed by the equipment racks. One or more embodiments of the systems disclosed herein are designed to remove heat produced by the electronic equipment within the data center and return cool air back to the data center.

One example of a method for heat removal in an IT environment includes a CRAC DX device that is paired with a dry cooler. A dry cooler, also referred to herein as a "dry heat rejection unit," or "outdoor heat exchanger" is a type of heat exchanger where air is used to cool the transport fluid (i.e., glycol) flowing through the cooling coils, as opposed to "wet" evaporative cooling techniques that spray water into the air stream to create a cooling effect. A dry cooler uses a series of condensing fans to perform its cooling function.

In this type of system, the refrigeration cycle components (e.g., the dry cooler) may be positioned in an enclosure external to the space being cooled and a heat exchanger may be positioned in the space being cooled. The heat exchanger uses flowing glycol to collect heat from the refrigerant from the CRAC DX device and transports it away from the IT environment. The glycol flows via pipes to the dry cooler where the heat is rejected to the outside atmosphere. A pump and other components, such as a motor, are used to circulate the glycol in its loop to and from the CRAC and dry cooler.

One advantage of a system that uses glycol as a heat transport fluid is that glycol pipes are capable of running much longer distances than refrigerant lines and can service several CRAC units from one dry cooler and pump assembly. In cold locations, glycol-cooled systems can take advantage of free cooling techniques where the outside atmosphere is used to cool the IT room. If the external temperature is low enough, the glycol within the dry cooler can be cooled to a temperature such that the CRAC unit can be bypassed. Under this condition, the refrigeration cycle (i.e., the CRAC) is turned off and an economizer coil cools the IT environment. Free cooling can provide significant operating cost reductions because less energy is used to perform the same cooling function.

Referring to FIG. 1A, a cooling system, generally indicated at 10, shows one example of a cooling system that combines a CRAC DX device with an economizing free cooling mode. The system 10 includes a CRAC DX device 110, a dry cooler 105, a free cooling device, which is also referred to herein as a chilled water (CW) coil 115, one or more fans 128, a compressor 130, and a heat exchanger 135. The glycol-cooled CRAC DX device 110, otherwise referred to herein as a "DX evaporator" uses refrigerant as the heat transport fluid 160A, also referred to herein as "heat transfer fluid." The dry cooler 105, also referred to as a "fluid cooler," is a device containing coils and fans that functions to transfer heat energy from heat transfer fluid 160B to the outside atmosphere. The CW coil 115 is an additional cooling coil containing heat transfer fluid 160B that functions as the free cooling component of the system. Heat transfer fluid 160B may comprise a mixture of ethylene glycol and water. The heat exchanger 135 is a device that functions to allow different fluids to transfer heat energy without mixing through the use of thin tubes or thin metal plates that separate the flowing fluids. Cooling system 10 may also include one or more pumps that function to pump the heat transfer fluids 160A and 160B throughout the system.

FIG. 1A is a diagram showing a first operating mode of cooling system 10 that uses DX cooling provided by the DX evaporator 110 to cool the IT environment, and is referred to herein as a "mechanical mode" of operation. The mechanical mode may be implemented when outdoor air is too hot or too humid to support the IT inlet set point and this mode operates as a normal closed circuit system. As shown in FIG. 1A, hot air from the IT environment enters the system at 170 and passes over the cooling coils of the self-contained refrigeration system of the DX evaporator 110. Conditioned air 165 exits the system and is introduced to the IT space using fan 128 and is used to cool the IT space. Heat transport fluid 160A leaving the DX evaporator 110 is in a low pressure gas state and is compressed to a hot, highly pressurized gas by a compressor 130 and passed to the heat exchanger 135, which functions as a condenser where the hot refrigerant condenses to a liquid. Heat is transferred from heat transfer fluid 160A to 160B in the heat exchanger 135. After passing through the heat exchanger 135, heat transfer fluid 160A is passed through an expansion valve 120 where it expands to the DX evaporator 110 pressure. Heat transferred to heat transport fluid 160B in the heat exchanger 135 from heat transport fluid 160A is discharged through dry cooler 105 as exhaust 175.

Figure 1B:
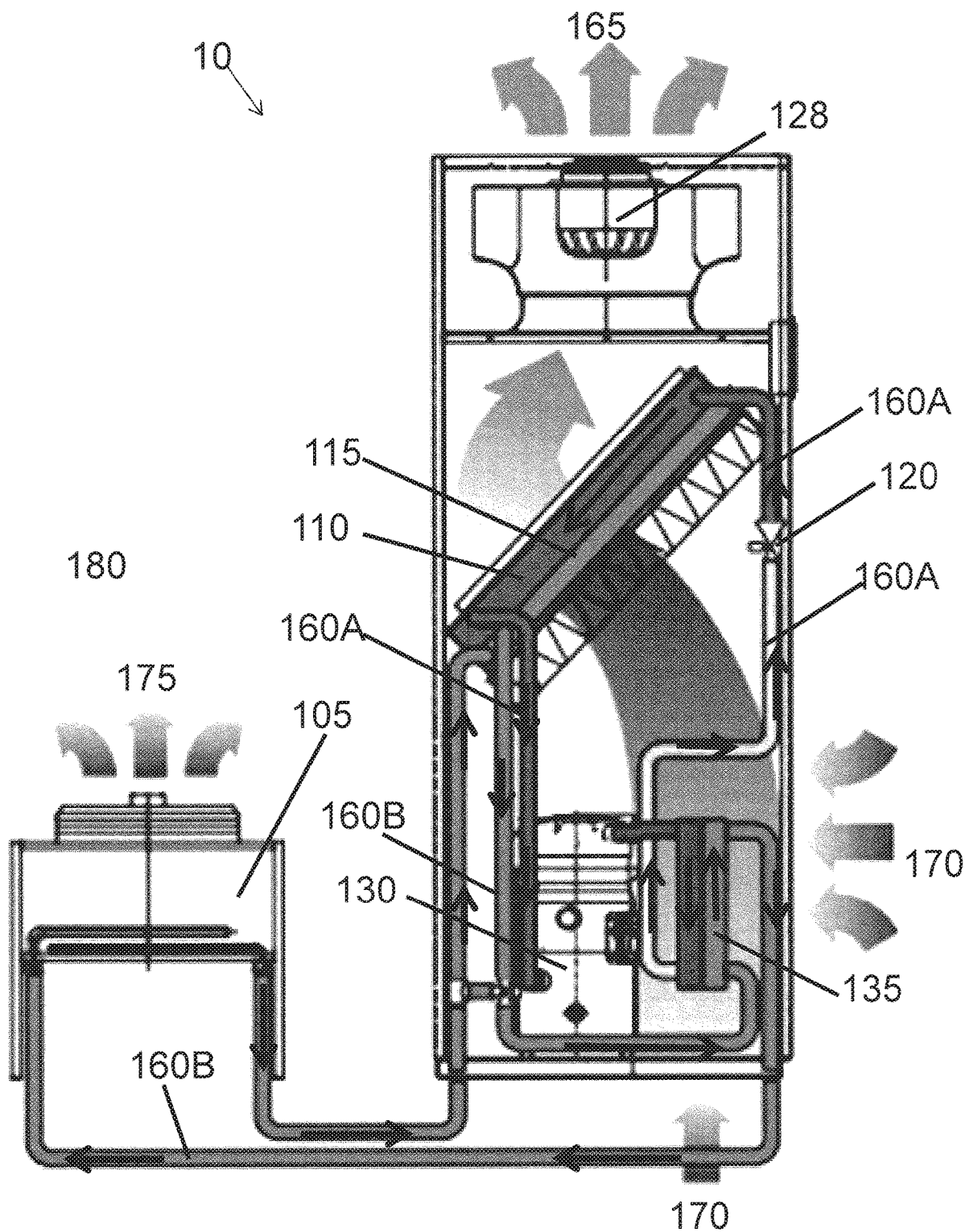
FIG. 1B is a schematic diagram of a cooling system operating in a second mode in accordance with one or more aspects of the invention.

FIG. 1B is a diagram showing a second operating mode, referred to herein as a "hybrid mode," of cooling system 10. As outside temperatures cool down, heat transfer fluid 160B may be implemented for at least partial "free cooling" of the hot IT air 170. In hybrid mode, both the DX evaporator 110 and the CW coil 115 contribute to cooling. Heat transfer fluid 160A flows in the self-contained circuit as discussed above in reference to FIG. 1A. In addition, heat transfer fluid 160B is circulated in the CW coil 115. Hot air 170 from the IT environment can thus be cooled first by the CW coil 115 and then by the DX evaporator 110 cooling coil such that the DX evaporator "assists" the CW coil 115. Heat transfer fluid 160B expels heat through the dry cooler 105. In the hybrid mode, the DX evaporator 110 can be operated at a lower setting than in the mechanical mode shown in FIG. 1A, which reduces the energy consumption for the cooling system 10. For instance, less energy is used by the compressor in the refrigerant loop containing heat transfer fluid 160A.

Figure 1C:
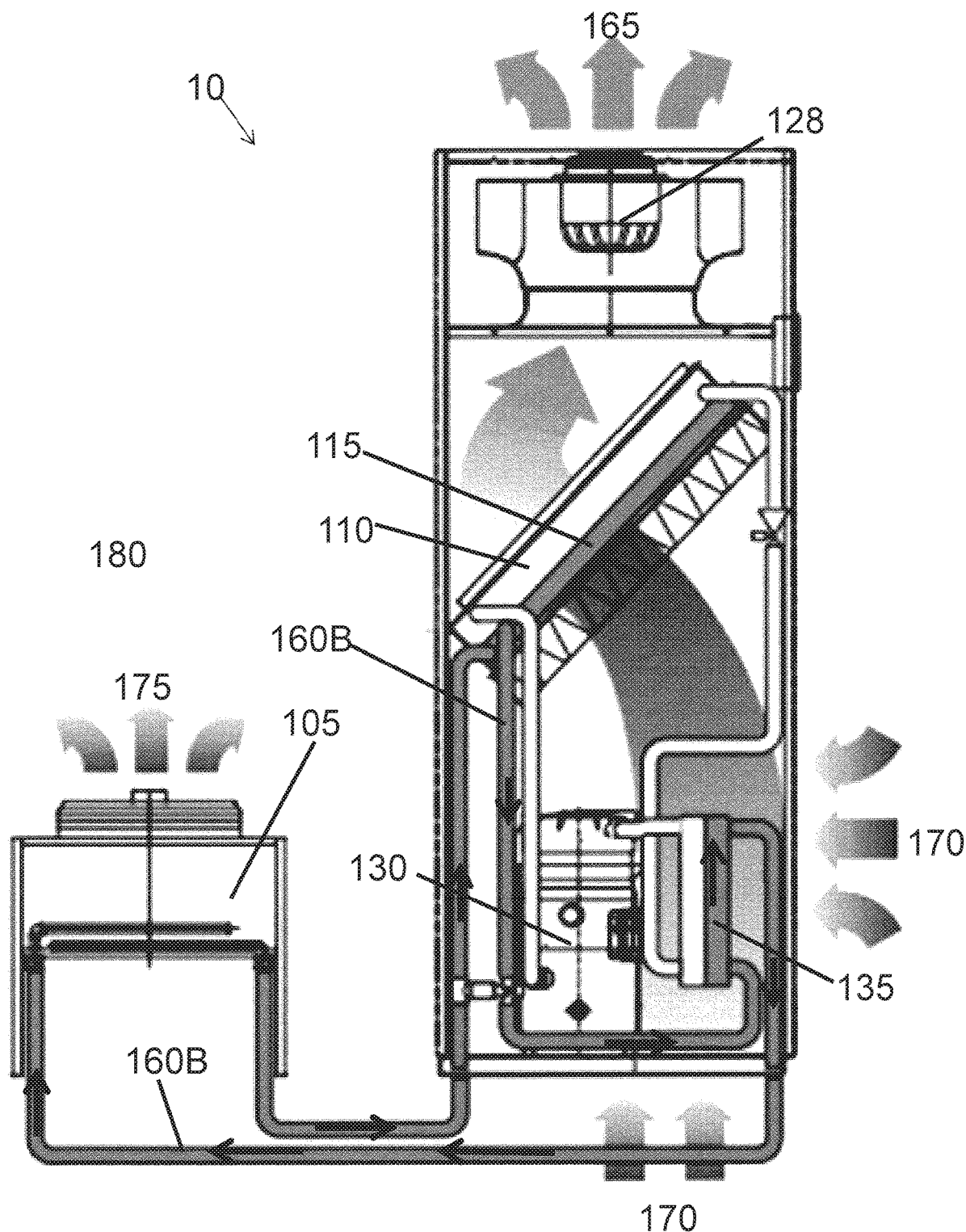
FIG. 1C is a schematic diagram of a cooling system operating in a third mode in accordance with one or more aspects of the invention.

A third "free cooling mode" of operating the cooling system 10 is shown in FIG. 1C. Free cooling may be used in instances where the outside temperature is sufficiently low enough to cool the heat transfer fluid 160B to a degree that is capable of cooling the hot IT air 170 to a set point temperature without using the DX evaporator 110. The cooling system 10 then functions as a chilled water unit that bypasses DX evaporator 110 and uses only CW coil 115 for cooling. Heat transport fluid 160B is cooled by external air 180 and is used to cool hot IT air 170 as it passes through the CW coil 115. Heat from the IT air 170 is transferred to the heat transport fluid 160B in the CW coil 115, which is then expended through dry cooler 105.

Figure 2:
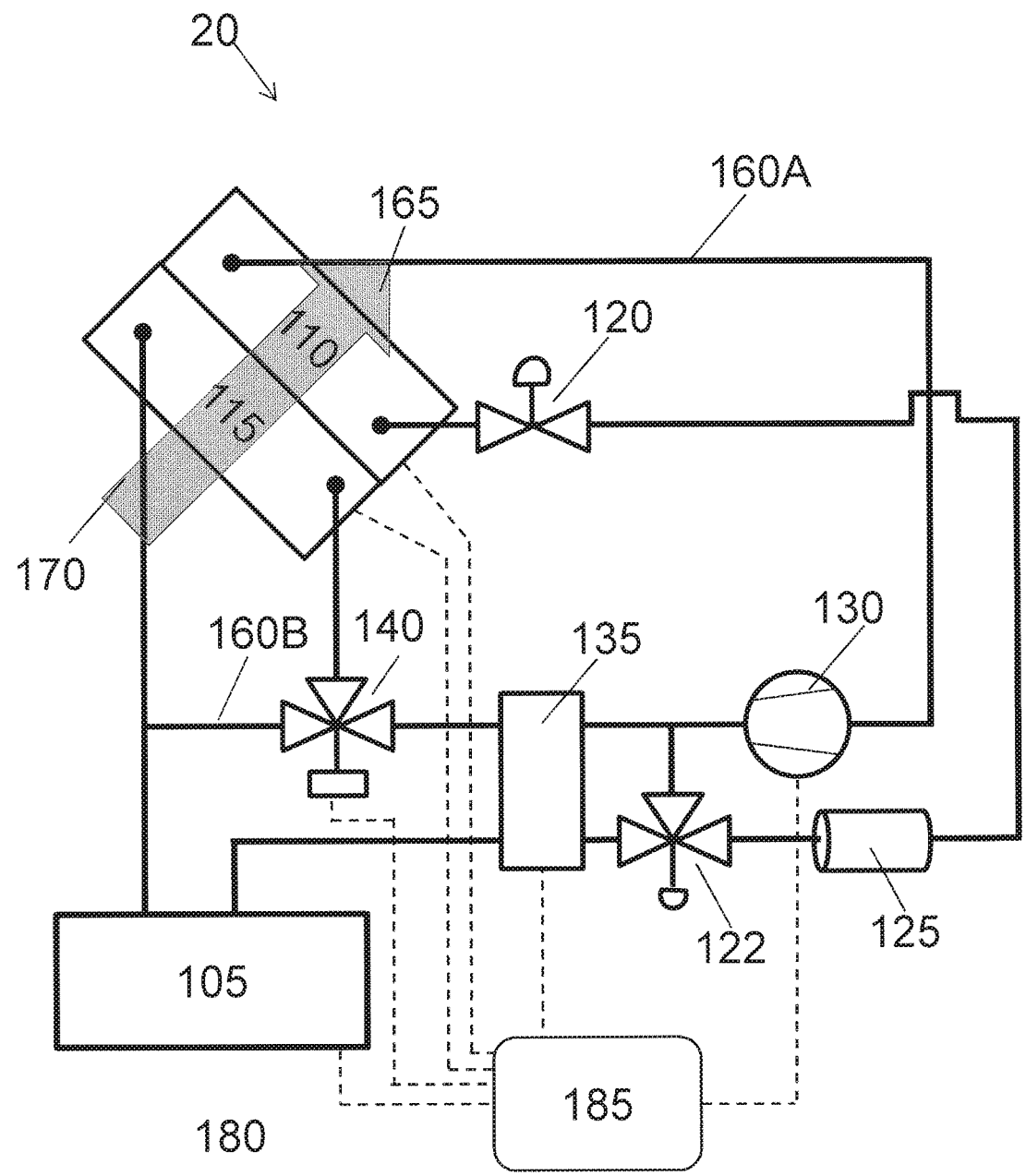
FIG. 2 is a block diagram of a cooling system configured for a free cooling mode of operation using a three-way modulating valve.

FIG. 2 is a block diagram of a cooling system 20 configured to operate in mechanical, hybrid, and free cooling mode using the components discussed above in reference to FIGS. 1A, 1B, and 1C. The cooling system 20 includes the DX evaporator 110, the CW coil 115, the heat exchanger 135, the dry cooler 105, the compressor 130, and the expansion valve 120. Cooling system 20 also includes a liquid receiver 125, a flooding valve 122, and a three-way modulating valve 140. In one embodiment, the liquid receiver 125 is a tank for storing heat transfer fluid 160A used in the cooling system 20 for operating DX evaporator 110. The liquid receiver 125 can be configured to store at least a portion of heat transfer fluid 160A depending on fluctuating changes in the pressure of the cooling system 20 and can function to flood the heat exchanger 135 using flooding valve 122. The flooding valve 122 functions to maintain a steady or minimum liquid pressure and/or temperature of heat transport fluid 160A in the cooling system 20. The compressor 130 functions to compress the heat transfer fluid to a higher pressure before entering the heat exchanger 135, as described above in reference to FIG. 1A. Although not explicitly shown in FIG. 2, cooling system 20 also includes one or more pumps for pumping heat transfer fluids 160A and 160B.

Cooling system 20 may also include a controller 185 that functions to control one or more components of the cooling system 20. For instance, the controller 185 may control one or more operating parameters of the DX evaporator 110, CW coil 115, heat exchanger 135, compressor 130, dry cooler 105, and/or flow control device 140. Sensors (not shown in FIG. 2) may be located in cooling system 20 that are configured to measure operating parameters, such as flow rate, temperature, and pressure. The sensors may send input signals to the controller 185 that are then used by the controller 185 to control components of the cooling system 20. For instance, the sensors may be used to control the components of cooling system 20 in an operating mode, as discussed further below.

The three-way modulating valve 140 is used to control the flow of heat transfer fluid through the cooling system 20 based on whether the system is operating in mechanical mode, hybrid mode, or free cooling mode. The three-way modulating valve 140 may also be used to modulate the flow through the CW coil 115 in instances where the capacity of the free cooling mode is exceeded. Each mode is discussed below in reference to FIGS. 2A, 2B, and 2C. Hot air 170 from the IT environment is cooled by at least one of the DX evaporator 110 and the CW coil 115 and exits as conditioned air 165 that is introduced back into the IT environment.

According to some embodiments, three-way modulating valve 140 may be a globe valve that uses a plug, i.e., a stem that closes against the flow of heat transfer fluid 160B. Valve 140 may also be fitted with or otherwise configured with an actuator or other control mechanism that controls the flow of heat transfer fluid 160 through the valve 140. The actuator may be configured to allow for flexible control configuration, i.e., floating or modulating, sequencing, position feedback etc. One example of a valve 140 and actuator suitable for use in system 20 is the VG310R series of valves available from Schneider Electric (North Andover, Mass., USA).

Figure 2A:
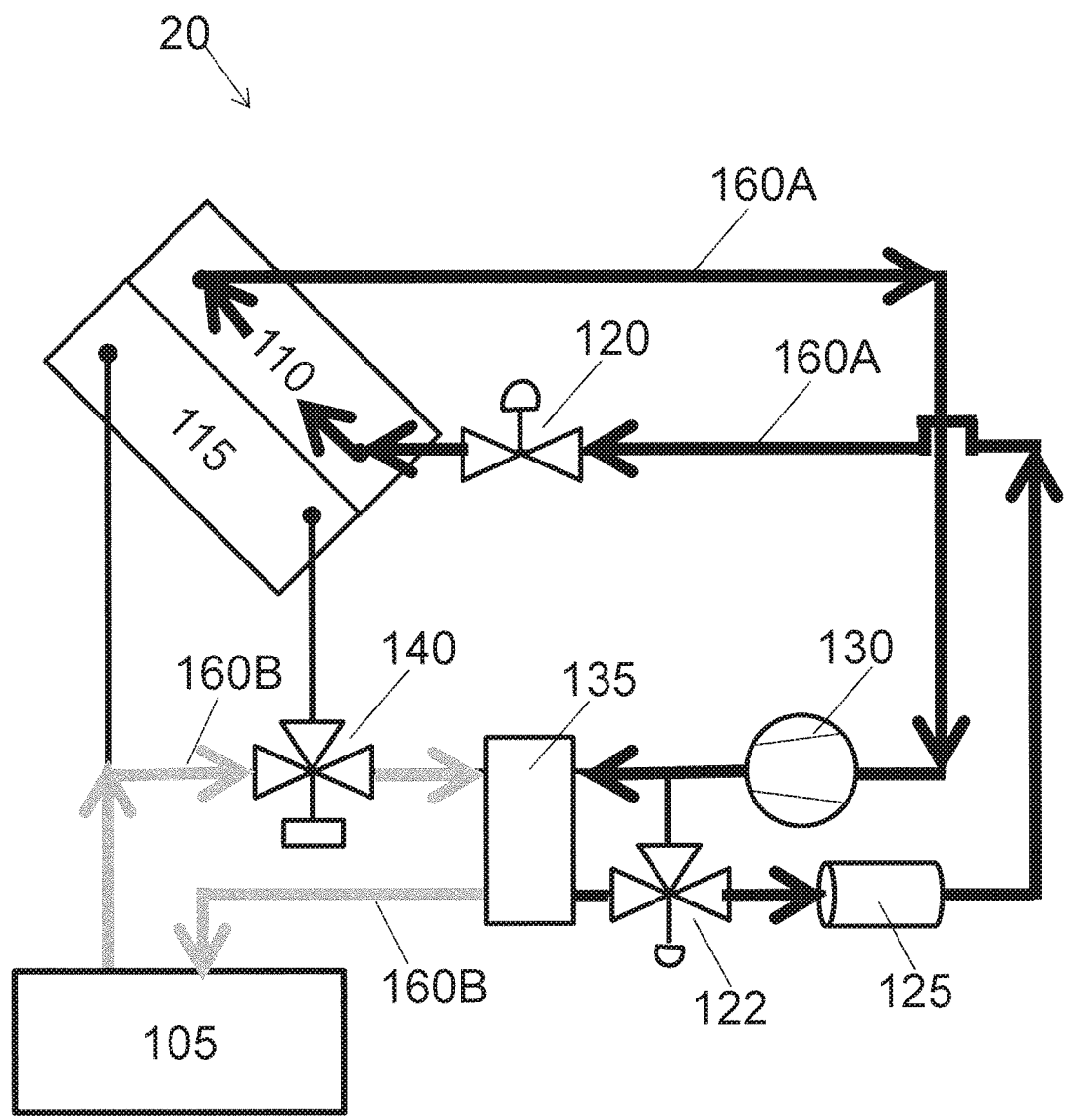
FIG. 2A is a block diagram of the cooling system of FIG. 2 operating in a mechanical mode of operation.

The mechanical mode of operation for cooling system 20 shown in FIG. 2A is similar to the mechanical mode discussed above in reference to FIG. 1A. Heat transfer fluid 160A is a refrigerant that undergoes the vapor compression refrigeration cycle as it evaporates to a low pressure in the DX evaporator 110 to cool air 170 from the IT environment and is then compressed by compressor 130 to a hot, highly pressurized gas and then condensed to a liquid in heat exchanger 135, which functions as a condenser. Heat transfer fluid 160A enters expansion valve 120 where it again expands to the pressure of the DX evaporator 110. Heat is transferred to heat transfer fluid 160B in heat exchanger 135, which is expelled using dry cooler 105. The flooding valve 122 and liquid receiver 125 each function as described above. During mechanical mode, the three-way modulating valve 140 is configured to direct the heat transfer fluid 160B such that it bypasses the CW chiller 115 (see arrows in FIG. 2A). A first inlet port of valve 140 in fluid communication with the dry cooler 105 can be opened to allow entry of heat transfer fluid 160B into the valve 140, which then directs the heat transfer fluid 160 to an exit port that is in fluid communication with the heat exchanger 135. Thus, valve 140 allows for heat transfer fluid 160B to be directed directly to the heat exchanger 135 from the dry cooler 105. The total drop in pressure for system 20 during mechanical mode is the sum of the total of the pressure drop across flow control device 140 and heat exchanger device 135.

Figure 2B:
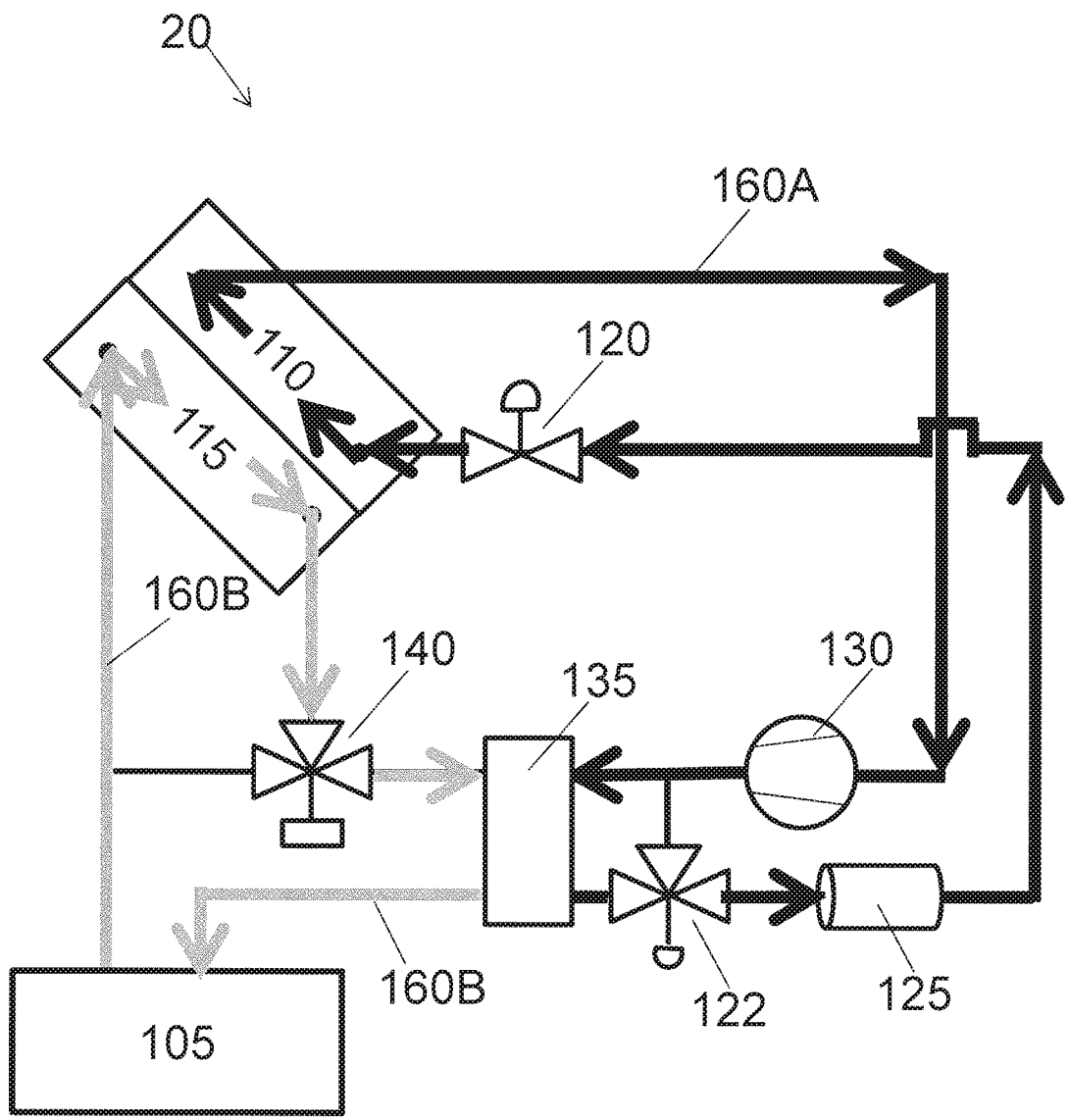
FIG. 2B is a block diagram of the cooling system of FIG. 2 operating in a hybrid mode of operation.

A hybrid mode for operating cooling system 20 is shown in FIG. 2B. In this mode, the outdoor air 180 temperature is low enough to contribute to cooling the hot air from the IT environment 170, but is not sufficiently low enough to cool the hot air to a set point temperature. Thus, in hybrid mode, the CW coil 115 assists the DX evaporator 110 in cooling the hot air from the IT environment 170. In this mode, the three-way modulating valve 140 is configured such that the first inlet port is closed, which results in the heat transfer fluid 160B being directed through the CW coil 115 (see arrows in FIG. 2B); thereby cooling the hot IT air 170. Heat transfer fluid 160B exiting CW coil 115 is directed to a second inlet port of valve 140, where it is then directed to the exit port in fluid communication with the heat exchanger 135. Thus, valve 140 allows for heat transfer fluid 160B to be directed through the CW coil 115 before being introduced to the heat exchanger 135. The hybrid mode allows for one or more devices of the vapor compression cycle that use heat transfer fluid 160A to use less energy. For instance, with the assist of the CW coil 115, less heat transfer fluid 160A is evaporated in the DX evaporator 110, and therefore the compressor 130 uses less power to compress the heat transfer fluid 160B into a pressurized gas state. The total drop in pressure for system 20 during hybrid mode is the sum of the pressure drop across flow control device 140, CW coil 115, and heat exchanger 135.

Figure 2C:
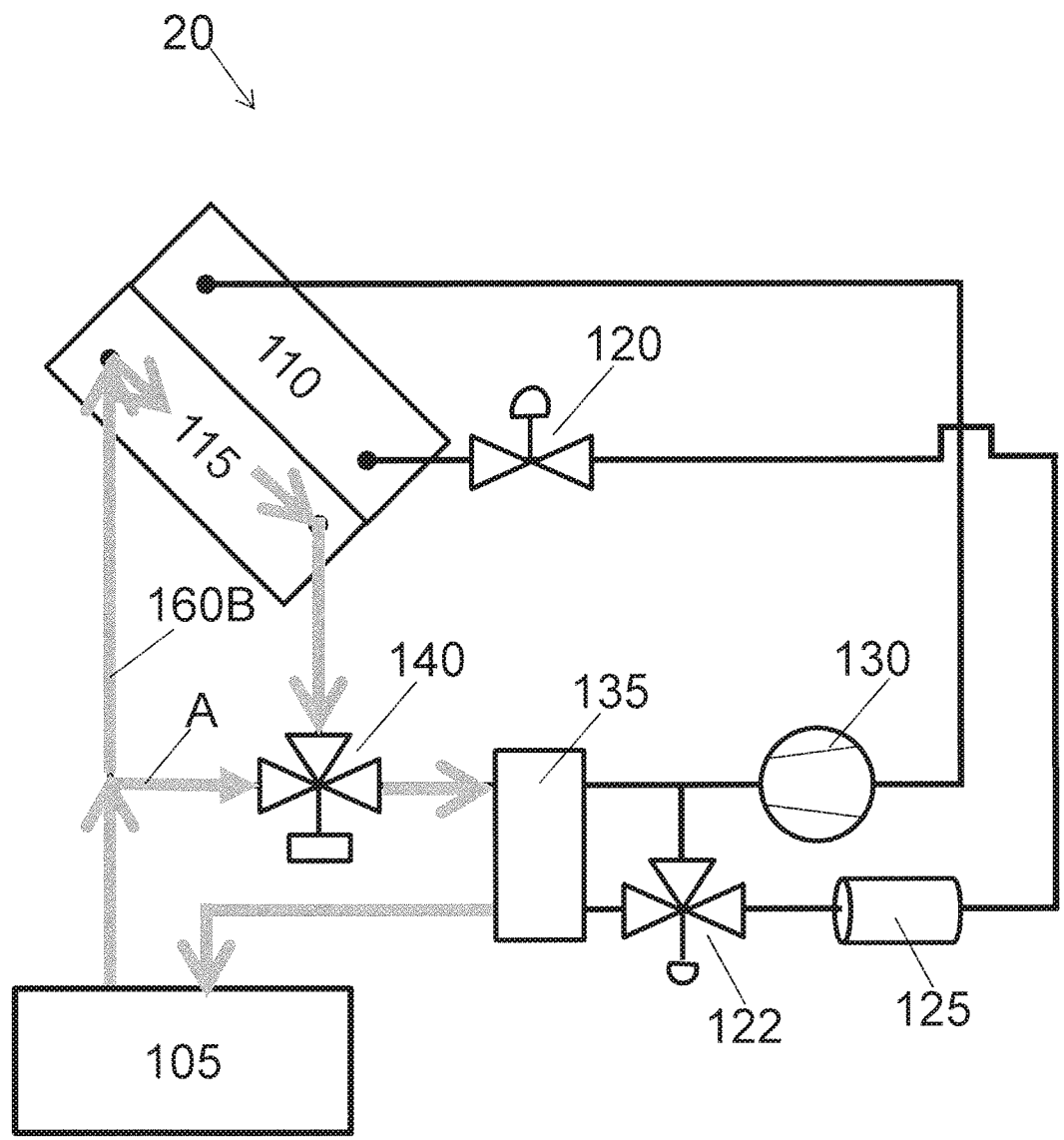
FIG. 2C is a block diagram of the cooling system of FIG. 2 operating in a free cooling mode of operation.

A free cooling mode for operating cooling system 20 is shown in FIG. 2C. In this mode, the temperature of the outdoor air 180 is low enough to cool the hot IT air 170 to the set point temperature on its own, without the DX evaporator 110. The vapor compression cycle is therefore unnecessary for cooling, and the heat transfer fluid 160A is not used in cooling the IT air 170. The three-way valve 140 may operate in the same manner as discussed above in FIG. 2B, in that heat transfer fluid 160B may be directed to CW coil 115 by closing the first inlet port and opening the second inlet port. Furthermore, when the inlet temperature of heat transfer fluid 160B to the CW coil 115 is too low, i.e., the associated cooling capacity of heat transfer fluid 160B is too high, the three-way modulating valve 140 can reduce the flow of heat transfer fluid 160B through the CW coil 115 by allowing at least a portion of heat transfer fluid 160B to bypass the CW coil 115 (shown as "A" in FIG. 2C). This has the effect of reducing the heat exchanging capacity of the CW coil 115. Heat transfer fluid 160B exiting CW coil 115 may then be directed to the outlet port and sent to the heat exchanger 135 before entering dry cooler 105 to expel heat. In the arrangement shown in FIG. 2C, the heat exchanger 135 simply functions as a conduit for heat transfer fluid 160B, since no thermal function occurs in the heat exchanger 135.

In an alternative arrangement, valve 140 may be configured to have a second outlet port (and in effect becoming a four-way valve) that directs the heat transfer fluid 160B directly to the dry cooler 105. In free cooling mode, the total drop in pressure for system 20 is the sum of the total pressure drop across the flow control device 140 and the heat exchanger 135.

When switching between different operating modes, pressure changes in the heat transfer fluid 160B can cause one or more problems. A pressure surge or wave, i.e., hydraulic shock, can occur when the heat transfer fluid 160B is forced to stop or change direction suddenly. For instance, when the free cooling mode is enabled, there is a pressure drop across the CW coil, the three-way modulating valve 140, and heat exchanger 135. When the free cooling mode is disabled, the pressure of the heat transfer fluid 160B drops due to the CW coil 115 being bypassed. Switching between mechanical mode and free cooling mode therefore changes the flow of the heat transfer fluid 160B, which can cause pressure waves. In addition, in instances where a pump configured with ON/OFF control is used, the water flow decreases in proportion to the water flow associated with the free cooling capacity. Furthermore, energy consumption of a pump that pumps heat transfer fluid 160B is increased during free cooling mode due to the drops in pressure.

Figure 3:
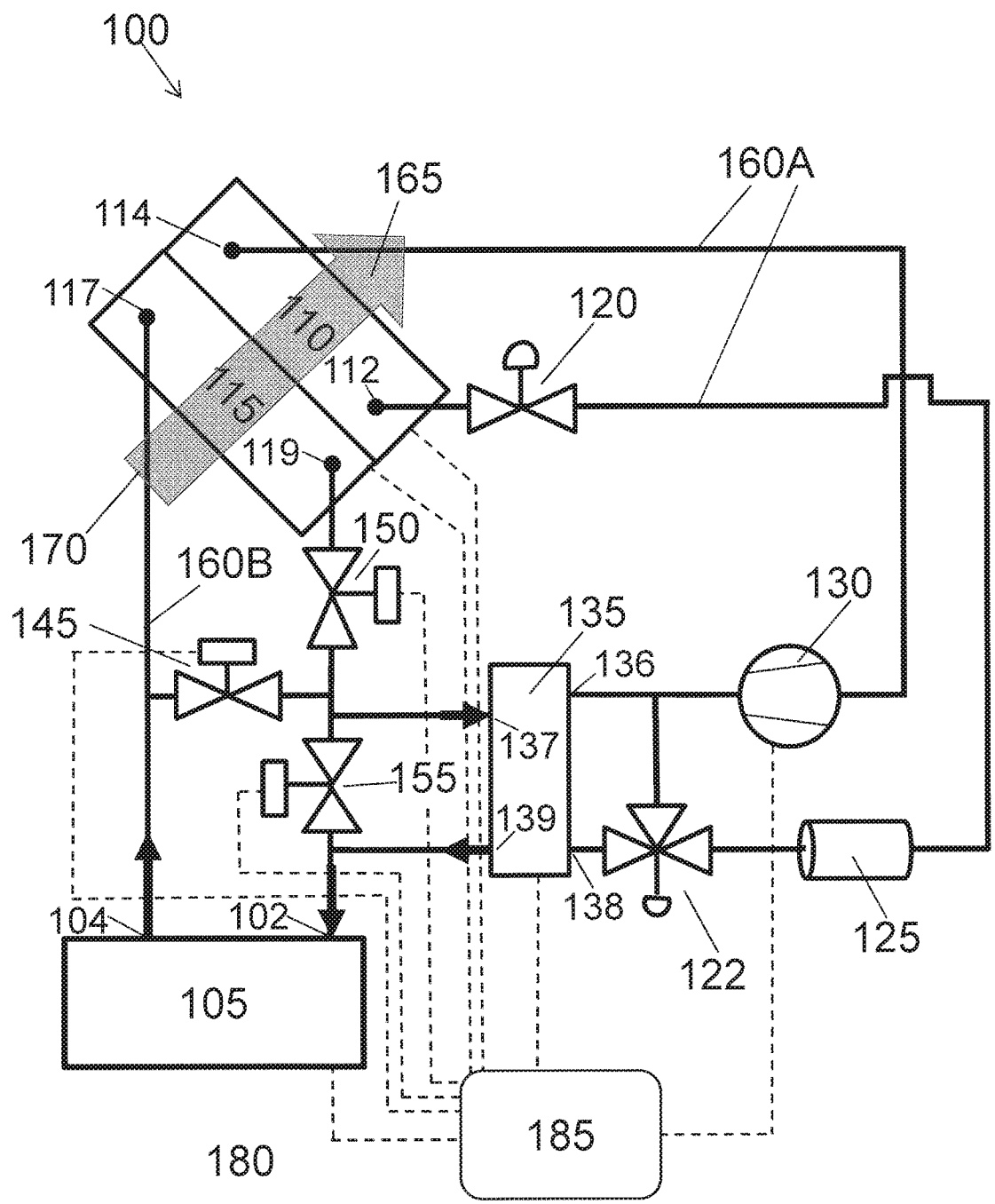
FIG. 3 is a block diagram of a cooling system in accordance with aspects of the invention.

FIG. 3 is a block diagram of a cooling system 100 that is configured to address one or more of the problems created in the system when switching between operating modes. Cooling system 100 includes several flow control devices that are configured to address the changes in pressure discussed above.

Cooling system 100 comprises the same cooling components as discussed above in reference to the cooling system 20 of FIG. 2. Cooling system 100 includes heat transfer fluid 160A that undergoes a vapor compression cycle via DX evaporator 110, compressor 130, heat exchanger 135, and expansion valve 120. Cooling system 100 also includes a dry cooler 105 that operates with heat transfer fluid 160B and CW coil 115 that may be operated in a hybrid and free cooling mode. Also indicated in FIG. 3 are inlets and outlets for various components of the cooling system 100. As shown, dry cooler 105 has an inlet 102 and an outlet 104, DX evaporator 110 has an inlet 112 and an outlet 114, CW coil 115 has an inlet 117 and an outlet 119, and heat exchanger 135 has a first inlet 137 and a first outlet 139 in fluid communication with heat transfer fluid 160B. The heat exchanger 135 may also have a second inlet 136 and a second outlet 139 that are in fluid communication with heat transfer fluid 160A.

Three-way modulating valve 140 shown in cooling system 20 of FIG. 2 is replaced in cooling system 100 by three flow control devices 145, 150, and 155, also referred to as "flow control valves," each of which is shown in FIG. 3. One or more of flow control devices 145, 150, and 155 may function to stabilize the pressure of heat transfer fluid 160B when cooling system 100 switches between operating modes.

Cooling system 100 also includes a controller 185 that functions to control components of the cooling system 20. For instance, the controller 185 may be a computer (or computers) that controls one or more operating parameters of the DX evaporator 110, CW coil 115, heat exchanger 135, compressor 130, dry cooler 105, and/or flow control devices 145, 150, and 155. For instance, each of the flow control devices 145, 150, and 155 may be fitted with an actuator. The actuators for each of the flow control devices 145, 150, and 155 may move a ball or other fluid control mechanism of the valve to a certain position based on the voltage or the input signal sent by the controller 185. The controller 185 may also receive signals from one or more sensors positioned in the cooling system 100 that are used by the controller 185 to trigger an operating mode.

According to one embodiment, flow control device 145 is positioned between the outlet 104 of the dry cooler 105 and inlet 137 of the heat exchanger 135. Flow control device 145 may be a modulating, (proportional control) valve that is configured to modulate, i.e., throttle, the flow of heat transfer fluid 160B. As such, flow control device 145 may experience internal velocity and internal pressure gradients that result in permanent pressure loss from inlet to outlet. According to some embodiments, flow control valve 145 is a modulating ball valve that can be modulated by rotating the ball valve shaft. Flow control device 145 may be modulated over a total valve position range from a full closed position to a full open position. In one embodiment, the flow control device 145 is a modulating motor-controlled valve. A controller 185 may be used to control an electric actuator that is configured to modulate flow control device 145 and is attached to flow control device 145 such that it rotates the ball valve shaft, i.e., moves the throttling device of the valve. The rotary actuator may therefore be controlled to move the ball of the valve to a position dictated by a positioning signal sent by the controller 185. For instance, the actuator may be configured to respond to a 0-10 volt DC modulating signal. A suitable valve 145 for use in system 100 includes the R4 2-way series of ball valves available from Belimo Holding AG, Hinwil, Switzerland.

In some embodiments, and as shown in FIG. 3, flow control valve 145 is positioned downstream from the dry cooler 105 and may be used to modulate the flow of heat transfer fluid 160B between the dry cooler 105 and the heat exchanger 135. For instance, during mechanical mode, flow control valve 145 may be used for controlling the pressure of heat transfer fluid 160B.

According to some embodiments, flow control devices 150 and 155 are ball valves. Suitable examples of flow control valves 150 and 155 are available from MUT MECCANICA TOVO S.p.A., Italy. Although control valves 150 and 155 may both be ball valves, according to at least one embodiment, flow control devices 150 and 155 are each fitted with actuators that are controlled differently i.e., each of flow control valves 150 and 155 controls flow of heat transfer fluid 160B differently. Flow control devices 150 and 155 may therefore be configured to minimize or substantially reduce internal pressure gradients and to experience velocity changes. In some embodiments flow control devices 150 and 155 are full-port (full-bore) ball valves.

According to certain embodiments, flow control device 155 is configured as an on/off control valve, meaning that as a control parameter deviates from a set point, the controller 185 outputs a signal that actuates flow control device 155 either on (or off), and when the control parameter is reached, the controller 185 outputs a signal that actuates flow control device 155 off (or on). Flow control device 155 may therefore be configured with an on/off actuator. Flow control device 155 can therefore be only completely open or completely closed. In some embodiments, flow control device 155 is configured as an on/off ball valve.

In accordance with some embodiments, flow control device 150 is positioned between the outlet 119 of CW coil 115 and inlet 137 of the heat exchanger 135. According to at least one embodiment, flow control device 150 is configured with floating control. In one embodiment, flow control device 150 is configured as a three-point ball valve fitted with an actuator that allows for three-point control of the ball of the valve, meaning that the actuator accommodates three different input signals from the controller 185. The actuator may therefore have three contacts for control, where one is common and the other two rotate in one director or another. In other words, the actuator has both clockwise (CW) and counter-clockwise (CCW) control inputs. One control input drives the actuator to move the ball to the open position, and the other control input drives the actuator to move the ball to the closed position. If there is no signal (the null point) on either of the other two inputs, the actuator simply stays in its last position. According to another embodiment, flow control device 150 may be configured to modulate the flow of heat transfer fluid 160B in the same manner as described above in reference to flow control device 145.

According to at least one embodiment, flow control device 150 is positioned downstream from the CW coil 115 and may be used to control the flow of heat transfer fluid 160B between the CW coil 115 and the heat exchanger 135. Flow control device 150 may also be used to control the flow of heat transfer fluid 160B to flow control device 155. As discussed in more detail below, flow control device 150 may be configured to modulate a flow of heat transfer fluid 160B in incremental steps of a predetermined amount. In some embodiments, flow control device 150 is an incremental motor-controlled valve.

In accordance with some embodiments, flow control device 155 is positioned downstream from flow control device 145 and flow control device 150. Flow control device 155 may be positioned between the outlet of fluid flow control device 145 and inlet 137 of the heat exchanger 135, and between the outlet of fluid flow control device 150 and inlet 137 of the heat exchanger 135. In one embodiment, flow control device 155 may be used to direct the flow of heat transfer fluid 160B to heat exchanger 135. In another embodiment, flow control device 155 may be used to direct the flow of heat transfer fluid 160B to dry cooler 105.

Flow control devices 145, 150, and 155 may be constructed from bronze, brass, or stainless steel materials and may be sized for a particular application.

According to one embodiment, flow control valve 145 may be characterized as an equal percentage valve, meaning that the valve's flow characteristic, i.e., the percentage of mass flow vs. valve position (%) (i.e., "flow" vs. "travel") is nonlinear in that the slope increases exponentially as the valve opens and equal increments of valve travel produce equal percentage changes in the existing flow coefficient $C_v$. In contrast, valves where flow capacity increases linearly with valve travel (i.e., a straight line) are characterized as linear valves.

According to some embodiments, the controller 185 may be configured to utilize the flow coefficient $C_v$ curve of one or more of flow control valves 145, 150, and 155 for controlling the flow control valves. In some embodiments this may be accomplished by measuring the valve opening and the pressure drop across the valve, which are read or otherwise inputted into the controller 185, in which there is stored $C_v$ curves of the valve as a function of the position of the closure member. By using a known flow equation, the controller 185 can solve for the required $C_v$ value and by utilizing the $C_v$ curve, the required position of the closure member for the valve can be obtained. As will be appreciated by those skilled in the art, the $C_v$ values for the valves will depend on the specific application and the size of the unit.

According to some embodiments, flow control devices 150 and 155 may be characterized as having high flow coefficient values. In certain embodiments, flow control devices 150 and 155 may have flow coefficient values of at least 200; however other values are within the scope of this disclosure. The flow coefficient values of flow control devices 150 and 155 may reflect values that represent minimized pressure drops. By comparison, the flow coefficient value for control device 145 may be characterized as having a low value. In some embodiments, the flow coefficient value for control device 145 may depend and be based on the pressure drop of the heat exchanger 115. For instance, the selection of control device 145 (and the corresponding flow coefficient value) may reflect a substantially similar pressure drop as the pressure drop of the heat exchanger 115. Having a similar pressure drop as the heat exchanger 115 allows for flow control device 145 to sufficiently accommodate and control the flow of heat transfer fluid 160B. Depending on the application, system, and associated flow rate, the flow coefficient for flow control device 145 may be less than 50, and in one embodiment, the flow coefficient for flow control device 145 is in a range of between 20 and 50. According to one example, the $C_v$ values for each of flow control valves 145, 150, and 155 are 46, 338, and 338, respectively.

Figure 3A:
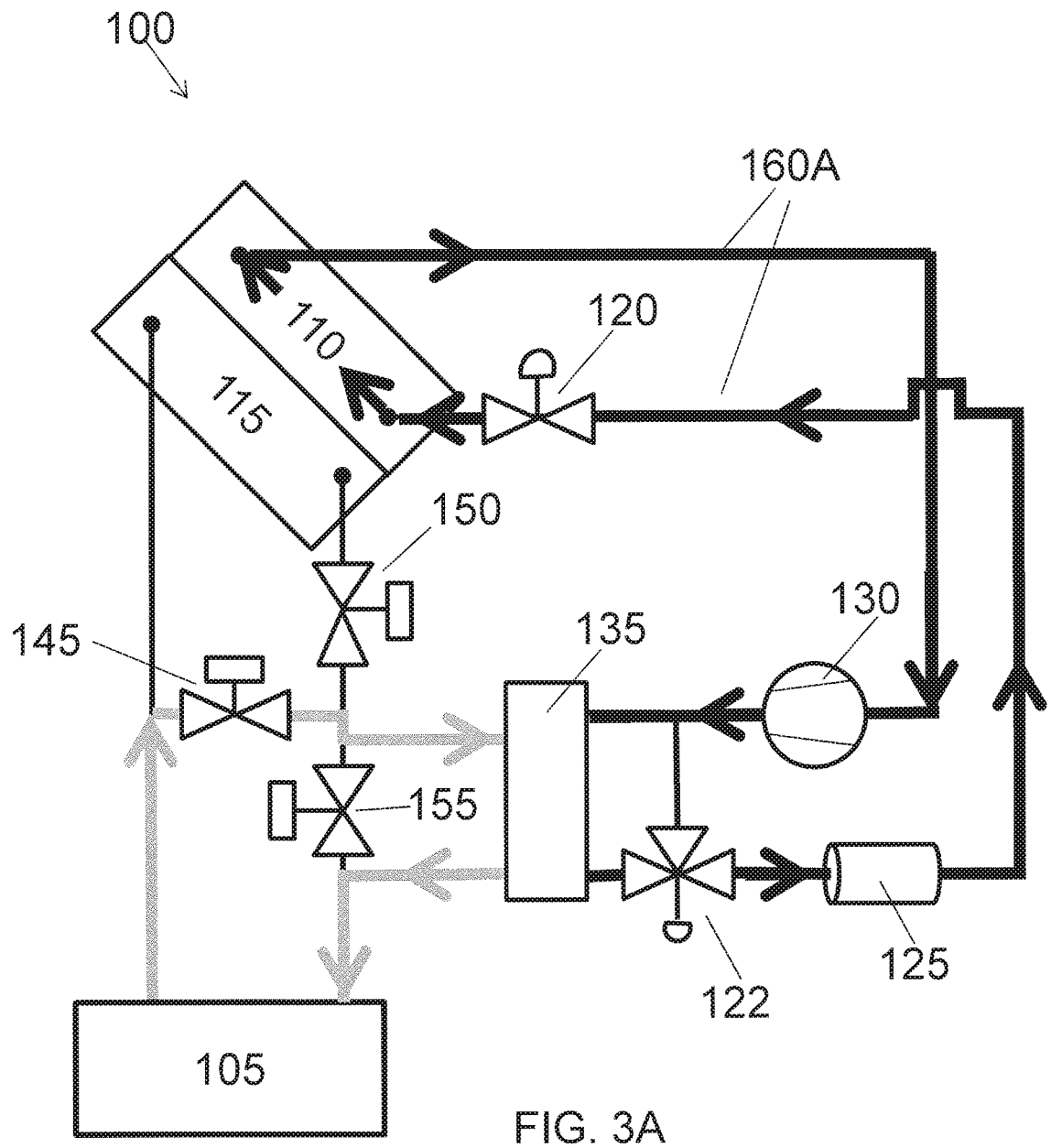
FIG. 3A is a block diagram of the cooling system of FIG. 3 operating in a mechanical mode of operation.

Referring to FIG. 3A, a mechanical mode similar to that discussed above in reference to FIGS. 1A and 2A is shown for cooling system 100 of FIG. 3. In mechanical mode, heat transfer fluid 160A undergoes the vapor compression cycle as described previously. Heat transfer fluid 160B transports heat away from heat transfer fluid 160A via the heat exchanger 135 to the dry cooler 105. In this mode, flow control device 145 is 100% open to direct heat transfer fluid 160B from the dry cooler 105 to the heat exchanger 135. Flow control devices 150 is 0% open, i.e., closed, and 155 is closed so that heat transfer fluid 160B bypasses the CW coil 115 and is introduced directly into the heat exchanger 135. The pressure drop for system 100 during mechanical mode is the sum of the pressure drop across flow control device 145 and heat exchanger 135.

Figure 3B:
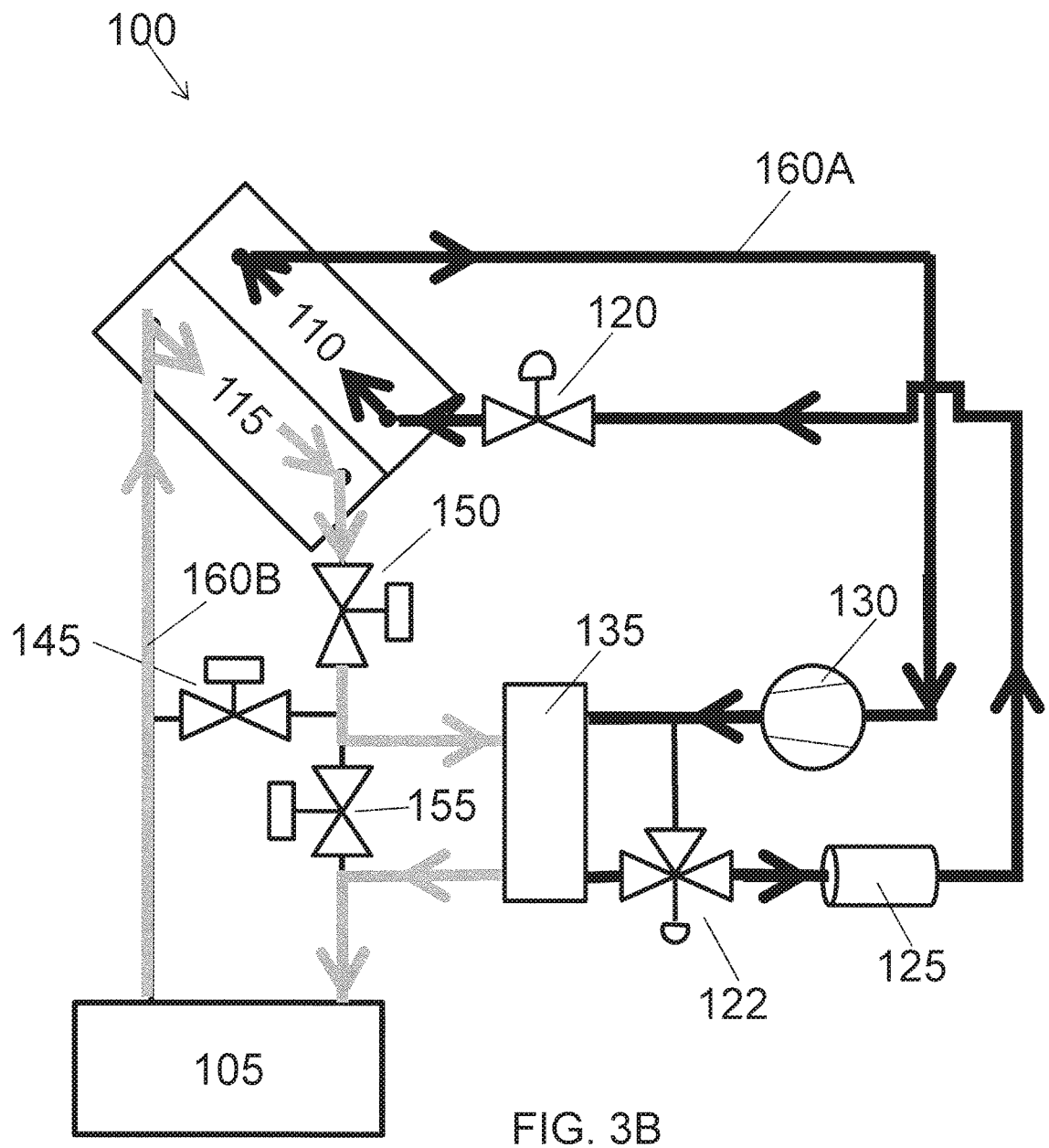
FIG. 3B is a block diagram of the cooling system of FIG. 3 operating in a hybrid mode of operation.

A hybrid mode of operation for cooling system 100 of FIG. 3 is shown in FIG. 3B and is similar in operation to the hybrid mode discussed above in reference to FIGS. 1B and 2B. However, in contrast to the mechanical mode shown in FIG. 3A, during this operating mode flow control device 145 is 0% open (i.e., closed) and flow control device 150 is 100% open so that heat transfer fluid 160B is directed through CW coil 115 and introduced to heat exchanger 135. Flow control device 155 therefore remains closed. The pressure drop for system 100 during hybrid mode is the pressure drop across the CW coil and the heat exchanger 135. Since flow control device 150 is configured to minimize pressure drop, little or no pressure drop is experienced across flow control device 150. For instance, flow control device may be configured as a full-port ball valve and/or have a high $C_v$ value.

Figure 3C:
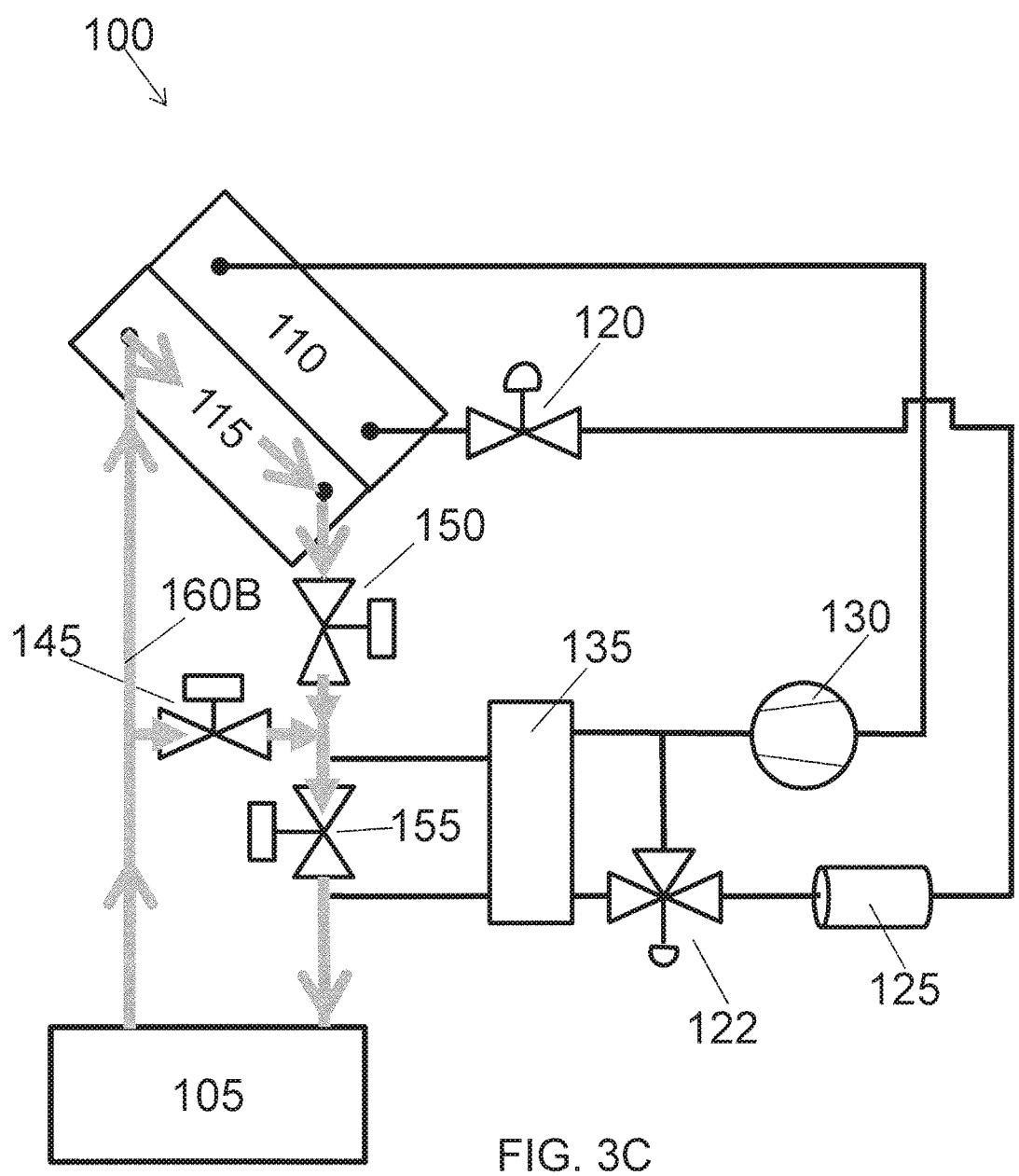
FIG. 3C is a block diagram of the cooling system of FIG. 3 operating in a free cooling mode of operation.

A free cooling mode of operation according to one embodiment for cooling system 100 is shown in FIG. 3C. During free cooling, the temperature of the outside air 180 is sufficiently cool enough to cool IT air to a set point temperature without the assistance of the evaporation cycle and heat transfer fluid 160A and in this respect is similar to the free cooling mode described above in reference to FIGS. 1C and 2C in the DX evaporator 110 is not used for cooling. However, as shown in FIG. 3C, all three of flow control devices 145, 150, and 155 may be used in controlling the flow of heat transfer fluid 160B from the dry cooler 105, where heat is expelled and the heat transfer fluid 160B is cooled by the outside air 180, to the CW coil 115, where heat is absorbed by the heat transfer fluid 160B from the hot IT air 170. According to one embodiment, during free cooling mode, both flow control devices 145 and 150 are modulated, as discussed in further detail below, such that heat transfer fluid 160B from dry cooler 105 can flow through the CW coil 115 or through flow control device 145. In addition, flow control device 155 is opened so that heat transfer fluid 160B coming from the dry cooler 105 that is directed through flow control device 145 and heat transfer fluid 160B from the CW coil 115 and directed through flow control device 150 bypasses the heat exchanger 135 and is directly introduced to the dry cooler 105. As discussed further below, in one embodiment flow control devices 145 and 150 are modulated based on the room load, i.e., the temperature of the IT air 170. For instance, if the room load is high, then the flow control device 145 can be configured to be more closed than open so that more heat transfer fluid 160B is directed to the CW coil 115 to cool the hot IT air 170. Likewise, if the heat load is low, then more heat transfer fluid 160B can be directed through flow control device 145 to bypass the CW coil 115. An example of a control scheme for controlling each of valves 145, 150, and 155 is discussed in further detail below in reference to FIG. 5.

Figure 4A:
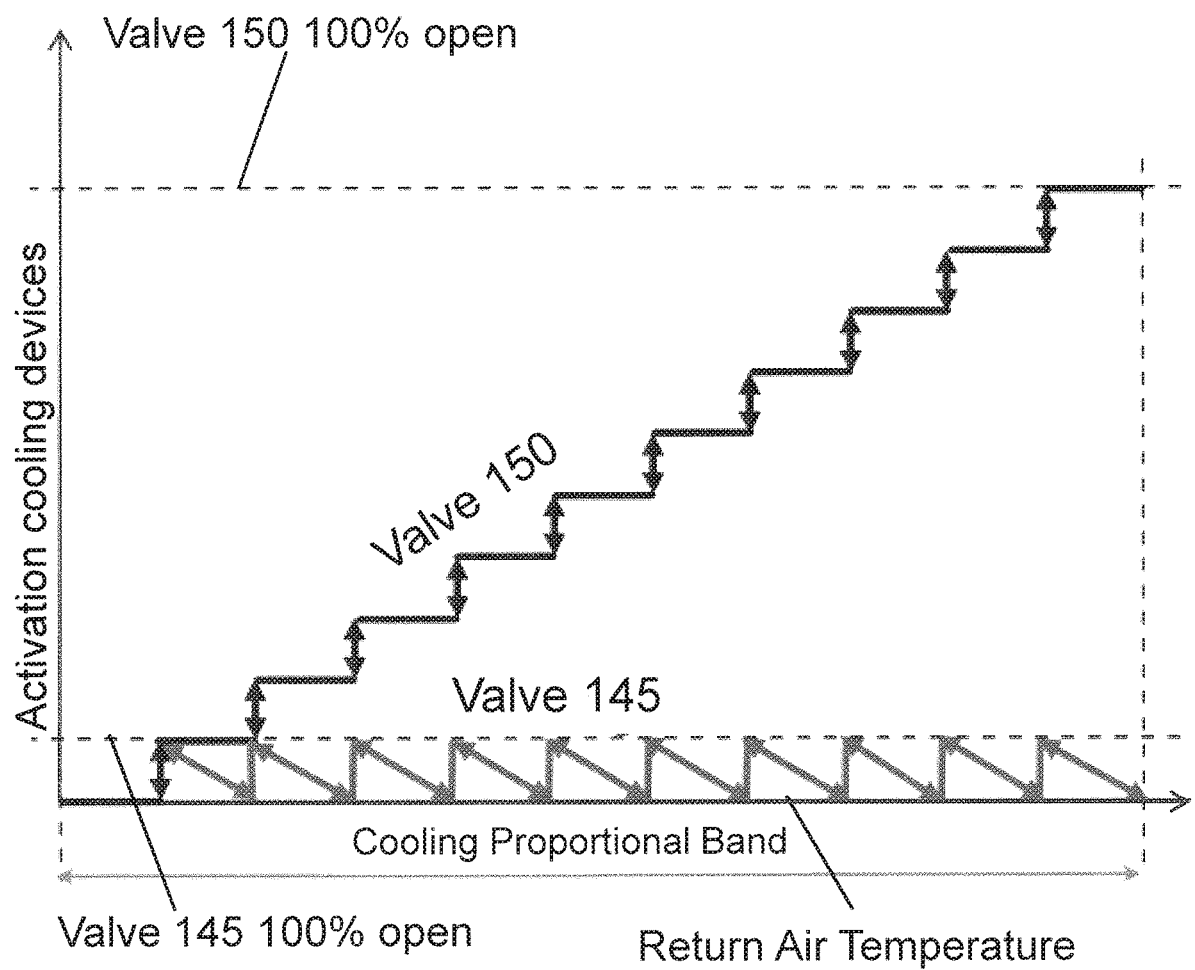
FIG. 4A is a graph showing a control scheme according to a first example in accordance with aspects of the invention.

In accordance with one embodiment, an example control scheme for operating cooling system 100 in the free cooling mode is shown in reference to FIGS. 4A-4D. During operation of the free cooling mode, when flow control device 145 is 100% open for more than a predetermined time period, then flow control device 150 is closed by a predetermined amount. For example, according to some embodiments, the predetermined time period may be on the scale of minutes, e.g., one minute or two minutes. The predetermined time period may be dependent on the specific application and system, and may vary accordingly. For instance, when flow control device 145 is 100% open for more than a predetermined time period, e.g., one minute, then flow control device 150 is closed by 10%. When flow control device 145 is 0% open for more than a predetermined time period, e.g., one minute, then flow control device 150 is opened by a predetermined amount. For example, when flow control device is 0% open for more than a predetermined time period, then flow control device 150 is opened by 10%. As shown in FIG. 4A, as CW coil 115 is ramped up to accommodate all of the heat load from the IT environment, flow control device 150 can be incrementally modulated to the 100% open position (see line on FIG. 4A). For instance, FIG. 4A shows valve 150 can be opened to the 100% position in increments of 10%. The 10% increments occur during periods when flow control device 145 is 0% open. When flow control device 145 is 100% open (see line shown in FIG. 4A), flow control device 150 is closed by 10%.

Figure 4B:
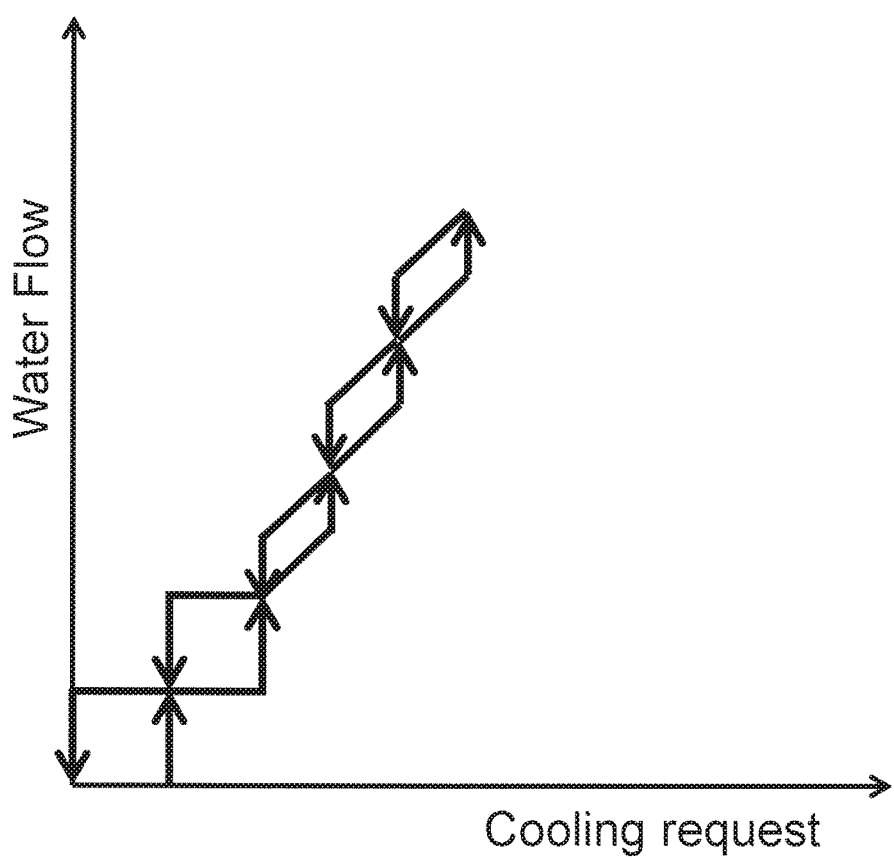
FIG. 4B is a graph showing a first portion of a control scheme according to a second example in accordance with aspects of the invention.
Figure 4C:
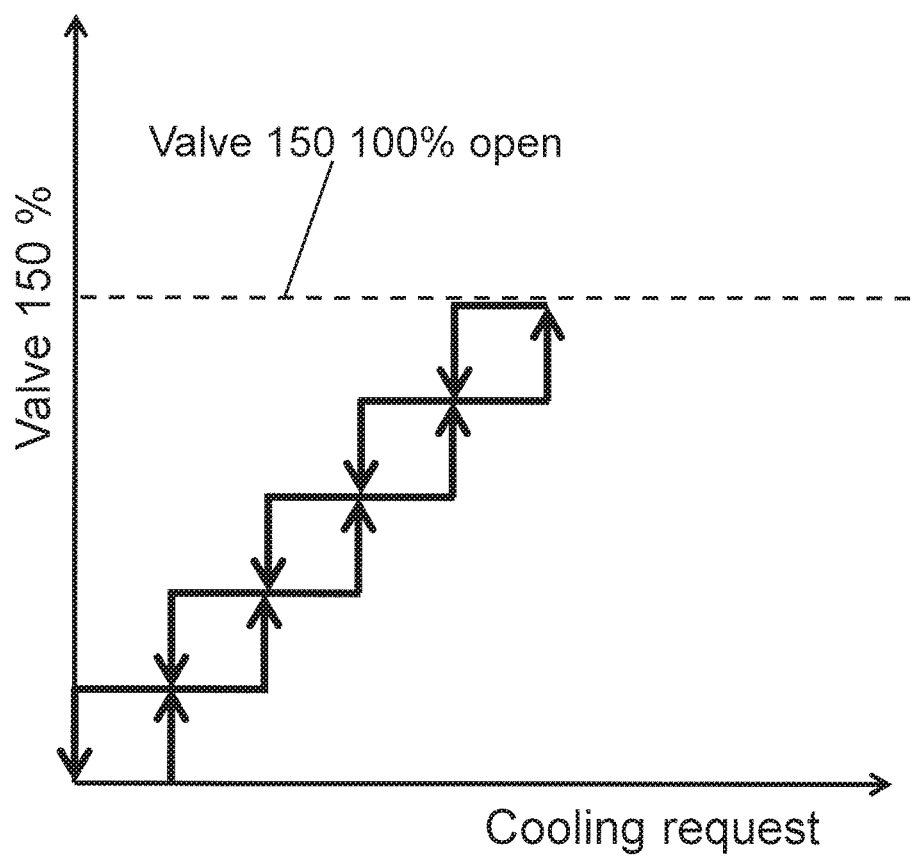
FIG. 4C is a graph showing a second portion of a control scheme according to the second example in accordance with aspects of the invention.
Figure 4D:
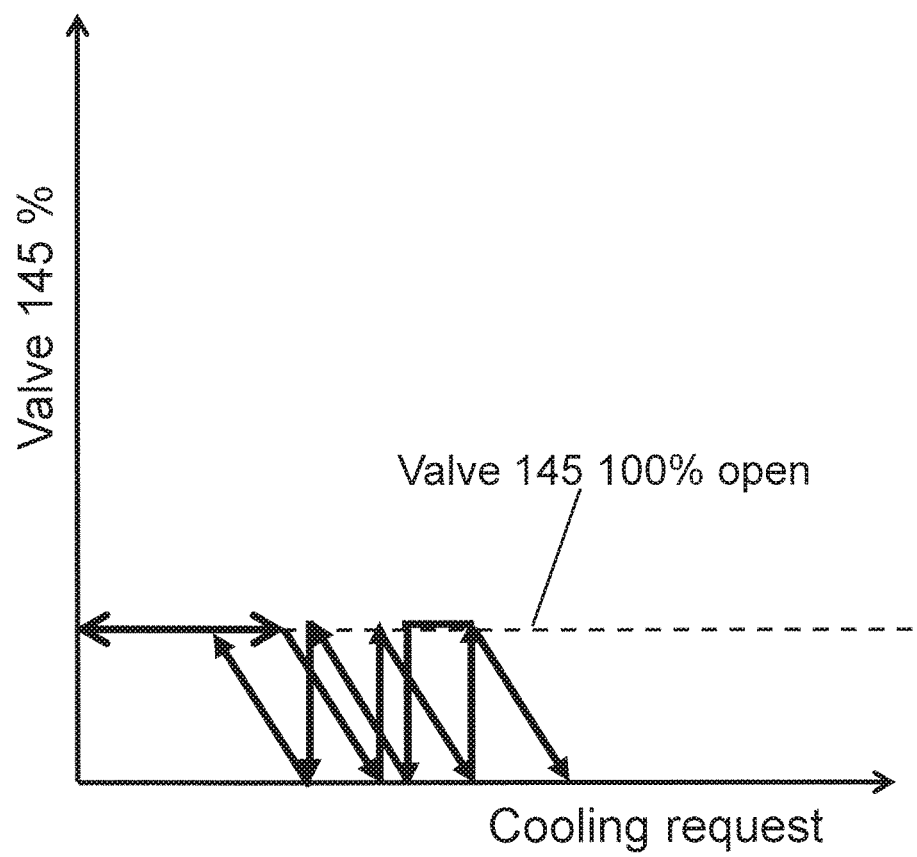
FIG. 4D is a graph showing a third portion of a control scheme according to the second example in accordance with aspects of the invention.

FIG. 4A is an example where the increments are in steps of 10%, but other values for the predetermined amount are within the scope of this disclosure. In some embodiments, the increments can be in a range from 1-30%. According to certain embodiments, the increments are uniform, e.g., 1%, 2%, 4%, 5%, 10%, 20%, or 25% such that 100% can be achieved in a whole number of steps. For instance, FIGS. 4B-4D shows similar information as FIG. 4A, but is an embodiment where the increment is 20%. FIG. 4B indicates the water flow velocity using a 20% increment, and FIGS. 4C and 4D show the valve actuation for flow control valves 150 and 145, respectively. Although the discussion herein includes examples where uniform increments are used, non-uniform increments may also be implemented, e.g., 15%, 30%, etc.

Figure 5:
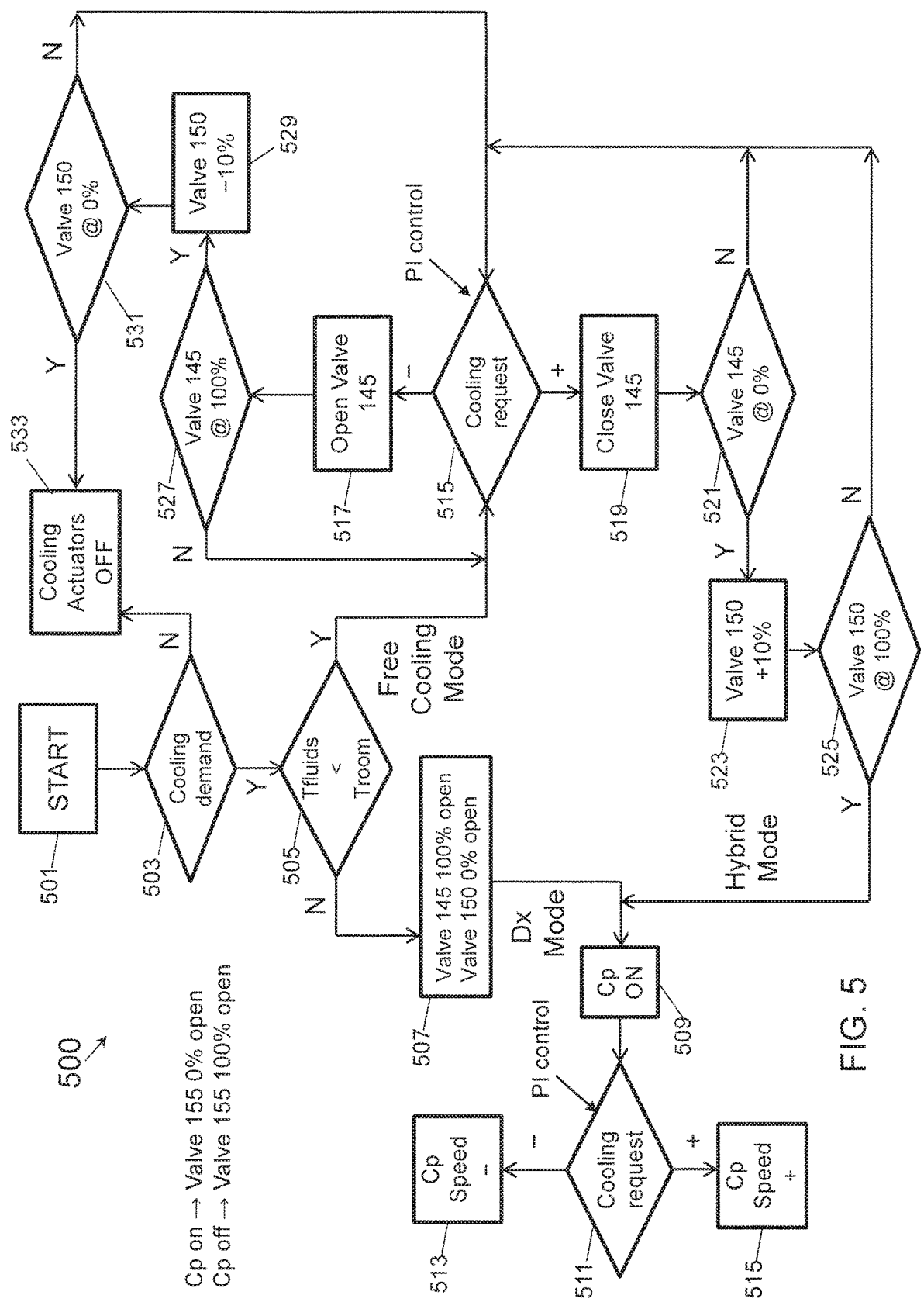
FIG. 5 is a flow chart of a control scheme in accordance with aspects of the invention.

FIG. 5 is an example of a control scheme, generally indicated at 500, for operating system 100 in the various cooling modes (mechanical, hybrid, and free cooling mode). According to some embodiments, the process 500 can be conducted by one or more components of system 100, including one or more of the components discussed above in reference to FIG. 3 and below in reference to FIG. 6. The controller 185 may be used to implement one or more of the determinations made in process 500 and as discussed below. These determinations may be based on measured data, such as temperature data taken from outside and from the indoor space being cooled and from the heat transfer fluid, and based on other sensor data or other information sent by components of system 100 and received by the controller 185.

The process 500 begins at 501 and at 503 in which a determination is made as to whether there is a cooling demand. For instance, based on a set point temperature, the controller 185 can make a determination as to whether there is a cooling demand for a space (e.g., IT space or other internal space) based on temperature information measured by sensors positioned in the space. A cooling demand would be acknowledged if the measured temperature of the indoor space is above that of the set point temperature. If the determination at 503 is no, then the cooling actuators (cooling components) are kept or turned off at 533. If the answer is yes at 503, then at 505 a second determination is made as to whether the temperature of the cooling fluids, e.g., heat transfer fluid 160B, is less than the temperature of the space to be cooled. If yes, this indicates an opportunity to use the free cooling mode (or hybrid mode). In other words, the outdoor air space is sufficiently cool enough to assist in cooling the space.

If the determination at 505 is no, then the process continues to 507 where the system 100 engages in the mechanical mode of operation, as shown in FIG. 3A. Controller 185 will control flow control device 145 to be 100% open and flow control device 150 to be 0% open, and at 509 the compressor 130 is turned on, indicating that flow control device 155 is 0% open. The compressor 130 can then be controlled based on the determination at 511, which, according to this example, uses a proportional-integral (PI) control function in determining whether further cooling is required in the space, which can be based on temperature measurements taken in the space and comparing them to the set point temperature. If more cooling is required, then the speed of the compressor 130 is increased (513), and if less cooling is required, then the speed of the compressor 130 is decreased (515).

If the determination at 505 is yes, then the system 100 operates in the free cooling mode, as shown in FIG. 3C. During free cooling mode, the compressor 130 is off, and flow control device 155 is controlled to be 100% open (as shown in FIG. 3C). According to the example shown in FIG. 5, a PI control function may be used at 515 for purposes of opening and closing flow control device 145. In some embodiments, this may be based on whether the CW coil 115 is providing too little or too much cooling, i.e., the measured temperature of the space is lower or higher than the set point temperature. Flow control device 145 is opened at 517, and at 527 a determination is made as to whether flow control device 145 has been 100% opened for a predetermined amount of time. If not, then the process returns to 515. If yes, then flow control device 150 is closed in incremental steps of a predetermined amount (529). The example shown in FIG. 5 indicates that the increment is 10%, but as discussed previously, other values for the increment are also within the scope of this disclosure. At 531, a determination is made as to whether flow control device 150 is 0% open. Once flow control device 150 is 0% open, then the process terminates at 533. If flow control device 150 is still open to some degree, then the process returns to 515 where the PI control function conducted by the controller 185 controls flow control device 145 by either opening (517) or closing (519) flow control device 145.

Closing flow control device 145 at 519 leads to 521, where a determination is made by the controller 185 as to whether flow control device 145 has been 0% open (completely shut) for a predetermined amount of time. If flow control device 145 is still open to some degree (the answer to the inquiry at 521 is no), then the process returns back to 515. If yes, then flow control device 150 may be opened in steps of a predetermined amount, which the example shown in process 500 is indicated as a 10% increment (523). Other incremental amounts, (non-limiting examples including 20% or 5%) are also within the scope of this disclosure.

At 525, a determination is made as to whether flow control device 150 is 100% open or not. If not, then the process returns to 515. However, once flow control device 150 is 100% open, then the free cooling capacity provided by CW coil 115 has been maximized. If there is still insufficient cooling, then assistance from the DX evaporator cooling coil 110 and heat transfer fluid 160A (refrigerant) is needed, and the system 100 enters into a hybrid mode of operation. The process then proceeds to 509, where the compressor 130 is turned on, and the PI control provided by 511 is used to eliminate the remaining deficit between the measured temperature of the indoor space and the desired set point temperature.

Whether the system 100 operates in hybrid or free cooling mode can be determined by whether the outdoor air temperature at 505 is sufficiently cool enough to provide the capacity to cool the indoor air space to the set point temperature without the aid of the refrigeration cycle. In some instances, this determination is based on whether there is a sufficient temperature difference between the external air temperature and the temperature of the indoor space to operate in full free cooling mode, and/or whether there is a sufficient temperature difference between the indoor return air temperature (uncooled air 170) and the temperature of the heat transfer fluid 160B entering the inlet 117 of the CW coil 115. This determination may also include whether assistance from the refrigeration cycle (mechanical mode) is needed, which indicates operating in the hybrid mode.

The incremental opening at 523, or closing at 529, of flow control device 150 is based on whether the CW coil 115 is providing too little or too much cooling capacity to cool the space. 519, 521, 523, and 525 are thus focused on using flow control devices 145 and 150 to flow more and more heat transfer fluid 160B through CW coil 115 (thereby increasing the free cooling contribution to cooling the indoor space). When the free cooling capacity is maximized and sufficient cooling has still not been achieved, then the refrigeration cycle (mechanical mode) is engaged to at least some degree. This will continue until free cooling is no longer available (e.g., the external temperature is higher than the temperature of the room to be cooled). 517, 527, 529, and 531 (and 533) are focused on using flow control devices 145 and 150 to flow less and less heat transfer fluid 160B through CW coil 115 (thereby decreasing the free cooling contribution to cooling the indoor space). When flow control device 150 is 0% open, cooling from the CW coil 115 is no longer necessary, and the cooling devices are turned off. The process would then begin again at 501.

Figure 6:
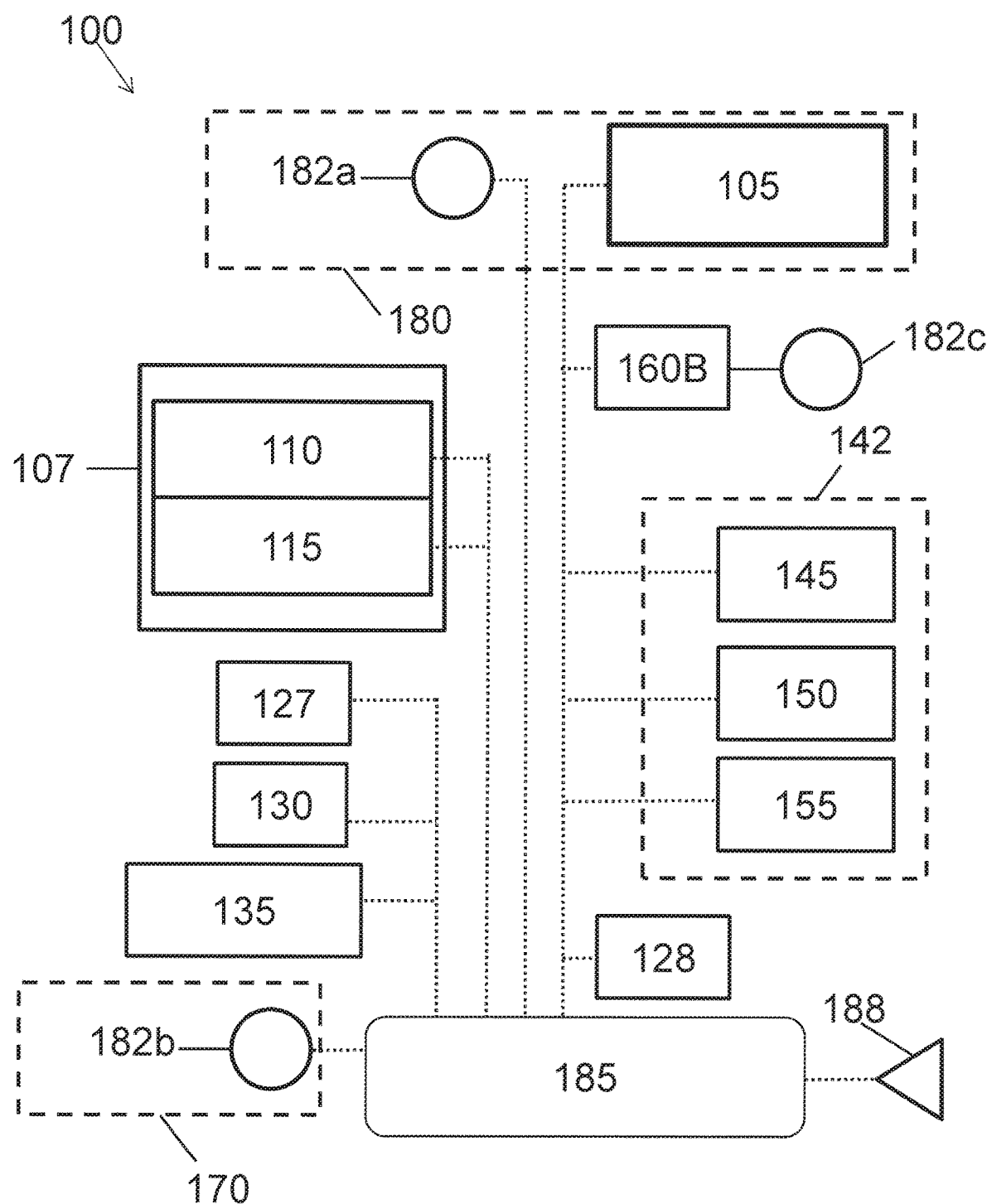
FIG. 6 is a block diagram of a cooling system in accordance with aspects of the invention.

Referring now to FIG. 6, a block diagram of the cooling system 100 is shown, and exemplifies certain components used to implement one or more aspects of the control process 500 discussed above in reference to FIG. 5, as well as other aspects used to implement the processes discussed herein. System 100 includes a cooling device 107, a first heat exchanger 135, a second heat exchanger 105, a system of fluid control devices 142, and a controller 185. The cooling device 107 may include a first cooling coil and a second cooling coil. The first cooling coil may be implemented in a DX evaporator 110, and the second cooling coil may be implemented in a CW coil 115, as discussed above. Although not explicitly shown in FIG. 6, a first heat transfer fluid, such as heat transfer fluid 160A, which can be a refrigerant, may be in fluid communication with the first cooling coil. In addition, the system 100 may include a second heat transfer fluid, such as heat transfer fluid 160B as shown in FIG. 6. Although not explicitly shown in FIG. 6, the second heat transfer fluid 160B may be in fluid communication with the second cooling coil. The first heat exchanger 135 functions in a similar manner as discussed above in reference to FIGS. 1A-3C, and may be in fluid communication with the first heat transfer fluid and the second heat transfer fluid. According to some embodiments, the first heat exchanger is a brazed plate heat exchanger, although other types of heat exchangers are within the scope of this disclosure, including other types of plate and frame heat exchangers, thin fin heat exchangers, and shell and tube heat exchangers. The second heat exchanger 105 functions in a similar manner as discussed above in reference to FIGS. 1A-3C, and may be in fluid communication with the second heat transfer fluid and a source of external air 180. In some embodiments, the second heat exchanger 105 is a dry cooler. The system of fluid control devices 142 may include one or more fluid control devices that are in fluid communication with the second heat transfer fluid. As discussed herein, the system of fluid control devices 142 may be configured to minimize a change in a total pressure drop of the second heat transfer fluid when the cooling system switches between operating modes. The system of fluid control devices 142 may also be configured to provide a substantially constant flow rate of the second heat transfer fluid when the cooling system 100 switches between operating modes.

According to one or more embodiments, including the example shown in FIG. 6, the system of fluid control devices 142 includes fluid control device 145, fluid control device 150, and fluid control device 155, which correspond to the fluid control devices discussed above in reference to FIGS. 3, 3A-C, 4A-4D, and 5. Although the systems and methods discussed herein include three fluid control devices, it is to be appreciated that more than three of these devices may be used depending on the application. In certain instances, for example, two or more of flow control devices configured as 145 may be used, and/or two or more of flow control devices configured as 150 or 155 may be used. Any combination of flow control devices may be used for purposes of reducing the pressure drop in the system in hybrid and/or free cooling modes or operation. The system 100 may also include one or more controllers 185, as previously described and discussed.

System 100 may also include one or more pumps 127, one or more fans 128, and one or more sensors 182, which are shown in FIG. 6 as sensors 182a, 182b, and 182c. Pump 127 may be used to pump the second heat transfer fluid through one or more components of the system 100, including the first heat exchanger 135, the second heat exchanger 105, the CW coil 115, and/or one or more flow control devices of the system of fluid control devices 142. When system 100 operates in mechanical or hybrid mode, a pump may also be used to pump the first heat transfer fluid through one or more components of the system 100, including the first heat exchanger 135 and the first cooling coil of the DX evaporator 110. During hybrid and mechanical mode, signals may be sent and/or received from the compressor 130 (between the compressor 130 and the controller 185) as well. As such, the compressor 130 is in fluid communication with the first heat transfer fluid. The controller 185 may control the compressor 130 by increasing or decreasing the speed of the compressor 130, as described above in reference to process 500 of FIG. 5.

One or more fans 128 may also be included in the system 100 for purposes of moving air to a desired location. For instance, a fan 128 may be positioned at the outlet of the cooling device 107 and may function to pull hot, uncooled air 170 from the indoor space being cooled through the cooling device 105 and back into the indoor space as conditioned air. For instance, FIGS. 1A-1C illustrate a fan 128 performing such a function. The system 100 may include several fans that are positioned at multiple locations in the system. For instance, the second heat exchanger 105 may include one or more fans for exhausting air out to the environment and pulling outside air in to the device.

One or more sensors 182 may also be included in system 100 that are configured to measure one or more operating parameters of the system and send the measured value to the controller 185. The system 100 shown in FIG. 6 includes sensor 182a that is configured to measure a temperature of outdoor air 180 and send this information to the controller 185. Sensor 182b is configured to measure the temperature of the return air, i.e., indoor air 170 of the space to be cooled. The system 100 also includes sensor 182c that is configured to measure a temperature of the second heat transfer fluid 160B. For instance, a temperature measurement taken of the second heat transfer fluid as it exits the second heat exchanger 105 (or inlet 117 as it enters the CW coil 115) may be compared against a temperature measurement taken of the indoor return air (uncooled air 170). The sensors may also be configured to receive input signals from the controller, such as a request for a measurement to be taken. Other sensors may also be included in the system 100. For instance, the temperature of air exiting the cooling device 107, the temperature of heat transfer fluid entering and/or exiting the heat exchangers (105 and/or 135) and/or cooling coils (110 and/or 115) may be measured, the humidity of the external and/or internal environment, the flow rates of air in the system, such as the flow rate of air exiting the cooling device 107 and/or the flow rate of air entering the cooling device 107.

As discussed in further detail below, the controller 185 may be configured to selectively control the cooling device 105 and the system of fluid control devices 142 to operate the cooling system 100 in each of the operating modes. The controller 185 is configured to be in communication with and control the other components of system 100, as indicated by the dotted lines. The controller 185 may be hard-wired and/or wirelessly connected to one or more of the components, and may receive and send information and signals using a variety of methods, including network communication methods. For instance, controller 185 may be configured to control actuators associated with each flow control device of the system of flow control devices 142 by sending control signals to the actuators of the flow control devices. In some instances, the actuators may also be configured to send signals or other information to the controller 185. For instance, information regarding the degree to which a flow control device is "open" or "closed" may be sent to the controller 185. The controller may also be in communication with one or more users, such as an operator, who may input a set point temperature 188 for the indoor space into the controller 185 through an interface, such as a keyboard or display or other electronic device capable of sending data to the controller. In other instances, the controller 185 may calculate or otherwise determine a set point temperature 188 based on one or more factors, including the functional and mechanical capacities of the cooling equipment used in a particular application. According to one embodiment, the set point temperature 188 is set at 37° C.

Using the set point temperature 188, the controller 185 can compare the predetermined set point temperature value 188 to the measured value from sensor 182b to perform function 503 of FIG. 5. Similar comparisons can also be made at 515 and 511 of FIG. 5 for purposes of performing the first part of the PI control function. If the measured value of the air in the indoor space is above the set point temperature, then the controller 185 goes on to make the determination at 505 by comparing measurements from sensors 182b and 182c. If the temperature of the second heat transfer fluid is below that of the indoor space to be cooled, then free cooling mode commences as the outcome of inquiry 505 of FIG. 5. If the temperature of the second heat transfer fluid is above that of the indoor space to be cooled, then system 100 operates in a mechanical mode. The controller therefore operates cooling system 100 in an analogous manner as shown in FIG. 3A, by directing the first heat transfer fluid (160A) through the first cooling coil of DX evaporator 110 and the first heat exchanger 135, and directing the second heat transfer fluid (160B) through flow control device 145 and the heat exchanger 135.

If the comparison performed at 505 of FIG. 5 indicates that the measured temperature value from sensor 182c (i.e., the temperature of the second heat transfer fluid 160B) is below that of measured temperature value from sensor 182b (i.e., the temperature of the indoor space to be cooled), then a free cooling mode of operation commences, and the controller operates cooling system 100 in an analogous manner as shown in FIG. 3C. The controller 185 may turn compressor 130 off, and open flow control device 155 such that it is 100% open. The controller 185 may direct heat transfer fluid 160B through the second cooling coil implemented in CW coil 115, fluid flow control device 155, and may modulate the flow of the second heat transfer fluid 160B through flow control device 145 and flow control device 150. As discussed above, modulating may comprise opening flow control device 145 for a predetermined time while closing flow control device 150 by a predetermined amount. Modulating may also comprise closing flow control device 145 for a predetermined time while opening flow control device 150 by a predetermined amount. As discussed above, in some embodiments, the predetermined time may include a waiting period while the flow control device 145 is open or shut. For instance, before flow control device 150 is opened by a predetermined amount (e.g., 10%) flow control device 145 may be closed for a period of time (e.g., 1 minute). During free cooling mode, the second heat transfer fluid 160B bypasses the first heat exchanger 135. According to one embodiment, during free cooling mode the temperature of heat transfer fluid 160B is about 21° C.

During hybrid mode, the controller 185 is configured to operate the cooling system 100 in a manner similar to that shown in FIG. 3B. The controller 185 directs the first heat transfer fluid (160A) through the first cooling coil (of DX evaporator 110) and the first heat exchanger 135, and directs the second heat transfer fluid (160B) through the second cooling coil (CW coil 115), flow control device 150, the first heat exchanger 135, and the second heat exchanger 105. Thus, flow control device 145 is bypassed during hybrid mode.

When switching from mechanical to hybrid mode, (or from hybrid to free cooling mode) the controller 185 is configured to reduce a cooling capacity of the compressor 130 and the first cooling coil of the DX evaporator 110 such that a temperature of the first heat transfer fluid entering inlet 136 of the first heat exchanger 135 in hybrid mode is lower than a temperature of the first heat transfer fluid entering inlet 136 in mechanical mode.

The temperature or temperature delta needed to reach the full free cooling mode can depend on a number of factors, including the design of the dry cooler 105. In one embodiment, the temperature of the heat transfer fluid exiting the dry cooler (i.e., the temperature of 160B at the outlet 104, or in some instances, the temperature of 160B at the inlet 117 of the CW coil 115) is measured and compared to the measured indoor return air temperature, e.g., uncooled air 170. If the difference between the indoor return air temperature and the exiting heat transfer fluid is within a predetermined range of values or is a predetermined value (e.g., about 3° C.), then the system 100 can operate in free cooling mode.

According to one embodiment, external air temperature measurements, such as temperature measurements performed by sensor 182a, may be used to manage the dry cooler 105 fan speed by the controller 185. For example, during a mechanical mode of operation, if the difference between the indoor air temperature and outdoor air temperature is less than a predetermined value, such as about 5° C., then the fan speed of the dry cooler 105 can be reduced for purposes of maximizing or optimizing energy efficiency, such as the energy efficiency ratio (EER) of the cooling system 100. This is because it is more efficient to expend energy into managing and using the refrigerant (heat transfer fluid 160a) as the main cooling mechanism during the mechanical mode of cooling. However, during free cooling or hybrid mode, when the difference between the indoor and outdoor air temperature is greater than a predetermined amount (e.g., greater than 5° C.) than the fan speed of the dry cooler 105 should be maximized to maximize the free cooling effect. In instances where the free cooling capacity is too high (e.g., the indoor air temperature falls too far below the set point temperature or the temperature of the heat transfer fluid 160B falls to value that is too low), then the fan speed of the dry cooler 105 can be reduced, which results in the temperature of the heat transfer fluid 160B increasing. Lowering the fan speed of the dry cooler 105 can provide an alternative to reducing and controlling the flow of heat transfer fluid 160B through flow control devices 145 and 150.

The controller 185 may be configured to determine an operating mode based on one of more of the set point temperature 185, the measured temperature value of the source of the second heat transfer fluid (182c), the measured temperature value of the source of external air (182a), and the measured temperature of the source of internal air (182b). In response, the controller 185 may selectively direct a heat transfer fluid (e.g., 160B) through the system of fluid control devices 142 such that a flow rate of the heat transfer fluid is substantially constant in all operating modes. Each operating mode comprises operating the first heat exchanger 105 in fluid communication with the heat transfer fluid and the source of external air 180, and at least one of the DX cooling device 110 and the free cooling device (CW coil 115).

The control schemes disclosed herein are configured to minimize the pressure drop in the system during hybrid and free cooling mode for purposes of saving the maximum amount of energy by allowing for higher flow velocities. When the capacity of the free cooling is too high, then flow control device 150 closes to balance the pressure drops across flow control device 145.

According to some embodiments, the total pressure drop of cooling system 100 during free cooling mode may be limited to only the pressure drop across the CW coil 115 (and the pressure drop across the dry cooler 105) because the pressure drop that would be experienced by flow control device 145 is alleviated by the incremental opening and closing of flow control device 150. Furthermore, this control scheme also allows for the flow velocity of heat transfer fluid 160B to be stable across all three modes of operation, including free cooling mode, which means that the energy consumption of a pump that pumps heat transfer fluid 160B remains relatively constant. In addition, in comparison to the free cooling mode discussed above in reference to cooling system 20, the energy consumed by a pump the pumps heat transfer fluid 160B in cooling system 100 is much less than that for cooling system 20.

An experiment was performed that compared the performance of cooling system 100 to the performance of cooling system 20 for all three operating modes (mechanical, hybrid, and free cooling). Table 1 below lists the estimated, i.e., modeled, values for different operating parameters for cooling system 20. The pressure drops in the pipes between components CW coil, control device 140, and heat exchanger 135, was not taken into account.

TABLE 1

Cooling system 20 parameters

| Operating Parameter | Unit | Mechanical Mode | Free Cooling Mode | Hybrid Mode |
|---|---|---|---|---|
| Heat transfer fluid 160B flow rate | m³/h | 10.85 | 10.53 | 9.32 |
| Pressure drop across CW coil 115 | kPa | 0 | 82.8 | 66.2 |
| Pressure drop across flow control device 140 | kPa | 24.32 | 22.91 | 17.95 |
| Pressure drop across heat exchanger 135 | kPa | 44.72 | 42.12 | 34.13 |
| Total pressure drop | kPa | 69.04 | 147.83 | 118.28 |
| Change in pressure drop | % | — | 114 | 71 |

Table 1 indicates that the pressure drop for cooling system 20 increased by 114% when switching between mechanical mode to free cooling mode and increased by 71% when switching between mechanical mode to hybrid mode.

In comparison, Table 2 below lists measured values for different operating parameters for a cooling system configured as cooling system 100 having the same flow rates as those estimated for control system 20 in Table 1. In this example, the estimate, i.e., modeled, pressure drop in the pipes is indicated.

TABLE 2

Cooling system 100 parameters

| Operating Parameter | Unit | Mechanical Mode | Free Cooling Mode | Hybrid Mode |
|---|---|---|---|---|
| Flow control device 150 | — | 0% open | 100% open | 100% open |
| Flow control device 155 | — | closed | open | closed |
| Flow control device 145 | — | 100% | 0% | 0% |
| Compressor speed | rpm | 6000 | 0 | 3000 |
| Total Power consumption | W | 17794.46 | 2874.28 | 7021.04 |
| Heat transfer fluid 160B flow rate | m³/h | 10.85 | 10.53 | 9.32 |
| Pressure drop across heat exchanger 135 | kPa | 44.72 | 4.35 | 34.13 |
| Total pressure drop | kPa | 85.89 | 88.8 | 107.22 |
| Change in pressure drop | % | — | 3 | 25 |
| Estimated pressure drop in pipes | kPa | 22.3 | 6.0 | 6.89 |

Table 3 below compares various parameters between system 20 and system 100. The calculations in Table 3 were performed using a pump efficiency of 50% and the systems were assumed to work ⅓ time in each operating mode. For instance, the change in pressure drop between system 20 and system 100 in the mechanical mode is equal to 69.04−(85.89−22.3)=5.5 kPa. The change in power represents the difference in power consumption between system 20 and system 100 for the pump to move the same amount of water. For instance, in mechanical mode the difference is 10.85*(3600/1000)*(5.5/0.5)=33.1, where 0.5 indicates the assumed pump efficiency. The percent change in power represents the weight of the pump consumption reduction on the total consumption of system 100. Thus, for mechanical mode, the percent change in power is 33.1/17794=0.19%.

TABLE 3

Comparison between system 20 and system 100

| Operating Parameter | Unit | Mechanical Mode | Free Cooling Mode | Hybrid Mode |
|---|---|---|---|---|
| Change in pressure drop of heat transfer fluid 160B | kPa | 5.5 | 65 | 17.9 |
| Change in pressure drop | % | 8.6 | 78.5 | 17.9 |
| Change in power | W | 33.1 | 380 | 93 |
| Change in power (%) | % | 0.19 | 13.24 | 1.32 |
| Energy consumption of pump | kWh | 96.6 | 1111 | 271 |
| Annual energy cost | € | 221.8* | | |

*@ €/kW = 0.15 with 1/3 time in each operating mode

In contrast to system 20, the pressure drop for cooling system 100 increased by 3% when switching between mechanical mode to free cooling mode and increased by 25% when switching between mechanical mode to hybrid mode. This means that the change in pressure drop of heat transfer fluid 160B for cooling system 100 is a maximum of 25%, whereas the change in pressure drop for cooling system 20 is a maximum of 114%. The results also indicate that at a fixed pump speed the water flow variation between all three modes is less than 15%. In addition, the estimated pumping consumption for the cooling system 20 is about 13% higher than for cooling system 100 in free cooling mode.

The aspects disclosed herein in accordance with the present invention, are not limited in their application to the details of construction and the arrangement of components set forth in the following description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A cooling system comprising:
    a cooling device including a first cooling coil and a second cooling coil;
    a first heat transfer fluid flowing through the first cooling coil;
    a second heat transfer fluid flowing through the second cooling coil;
    a first heat exchanger in fluid communication with the first heat transfer fluid and the second heat transfer fluid;
    a second heat exchanger in fluid communication with the second heat transfer fluid and a source of external air;
    a system of fluid control devices in fluid communication with the second heat transfer fluid; and
    a controller configured to selectively control the cooling device and the system of fluid control devices to operate the cooling system in a plurality of operating modes, wherein the plurality of operating modes controls one or more operating parameters of the system of fluid control devices,
    wherein the controller is configured to operate the system of fluid control devices to minimize a change in a total pressure drop of the second heat transfer fluid when the cooling system switches between the plurality of operating modes, and
    wherein the controller further is configured to minimize an absolute difference in a total pressure of the cooling system when the cooling system changes modes within the plurality of operating modes, the absolute difference in the total pressure of the cooling system being a difference in the operating pressure in one mode and an operating pressure in another mode.

2. The cooling system of claim 1, wherein the system of fluid control devices includes a first valve positioned between an outlet of the second heat exchanger and an inlet of the first heat exchanger, the first valve configured to be modulated over a total valve position range from a full closed position to a full open position.

3. The cooling system of claim 2, wherein the system of fluid control devices further comprises a second valve positioned between the outlet of the second cooling coil and the inlet of the first heat exchanger, the second valve configured to modulate a flow of the second heat transfer fluid in incremental steps of a predetermined amount.

4. The cooling system of claim 3, wherein the system of fluid control devices further includes a third valve positioned between outlets of the first and second valves and an inlet to the second heat exchanger, the third valve configured as an on/off control valve.

5. The cooling system of claim 3, wherein the controller is configured to operate the cooling system in a first operating mode by directing the first heat transfer fluid through the first cooling coil and the first heat exchanger, and directing the second heat transfer fluid through the first valve, the first heat exchanger, and the second heat exchanger.

6. The cooling system of claim 5, wherein the controller is configured to operate the cooling system in a second operating mode by directing the first heat transfer fluid through the first cooling coil and the first heat exchanger, and directing the second heat transfer fluid through the second cooling coil, the second valve, the first heat exchanger, and the second heat exchanger.

7. The cooling system of claim 6, wherein the inlet of the first heat exchanger is a first inlet, the cooling system further includes a compressor in fluid communication with the first heat transfer fluid and positioned in between an outlet of the first cooling coil and a second inlet of the first heat exchanger, wherein the controller is configured to reduce a cooling capacity of the compressor and the first cooling coil in the second operating mode such that a temperature of the first heat transfer fluid entering the second inlet in the second operating mode is lower than a temperature of the first heat transfer fluid entering the second inlet in the first operating mode.

8. The cooling system of claim 4, wherein the controller is configured to operate the cooling system in a third operating mode by directing the second heat transfer fluid through the second cooling coil, the third valve, and the second heat exchanger, and modulating the flow of the second heat transfer fluid through the first valve and the second valve.

9. The cooling system of claim 8, wherein the controller is configured to modulate the flow of the second heat transfer fluid by opening the first valve for a predetermined time while closing the second valve by a predetermined amount.

10. The cooling system of claim 8, wherein the controller is configured to modulate the flow of the second heat transfer fluid by closing the first valve for a predetermined time while opening the second valve by a predetermined amount.

11. The cooling system of claim 1, further includes at least one temperature sensor in communication with the controller, and the controller is further configured to determine an operating mode based at least in part on an input signal from the at least one temperature sensor.

12. The cooling system of claim 1, wherein the first heat exchanger is a condenser, the second heat exchanger is a dry cooler, the first heat transfer fluid is a refrigerant, and the second heat transfer fluid includes at least one of glycol and water.

13. The cooling system of claim 1, wherein the controller is further configured to operate the system of fluid control devices to provide a constant flow rate of the second heat transfer fluid when the cooling system switches between operating modes.

14. The cooling system of claim 8, wherein the system of fluid control devices is configured to maintain at a fixed pump speed when the cooling system switches between the operating modes, wherein a flow variation of the second heat transfer fluid varies by less than about 15% between the operating modes.

15. A cooling system comprising:
- a cooling device including a first cooling coil and a second cooling coil;
- a first heat transfer fluid flowing through the first cooling coil;
- a second heat transfer fluid flowing through the second cooling coil;
- a first heat exchanger in fluid communication with the first heat transfer fluid and the second heat transfer fluid;
- a second heat exchanger in fluid communication with the second heat transfer fluid and a source of external air;
- a system of fluid control devices in fluid communication with the second heat transfer fluid; and
- a controller configured to selectively control the cooling device and the system of fluid control devices to operate the cooling system in a plurality of operating modes, wherein the plurality of operating modes controls one or more operating parameters of the system of fluid control devices,
- wherein the controller is configured to operate the system of fluid control devices to minimize a change in a total pressure drop of the second heat transfer fluid when the cooling system switches between the plurality of operating mode, and
- wherein the system of fluid control devices is configured to maintain at a fixed pump speed when the cooling system switches between operating modes, wherein a flow variation of the second heat transfer fluid varies by less than about 15% between the operating modes.

16. A non-transitory computer-readable medium containing thereon instructions for a cooling system including a cooling device having a first cooling coil, a second cooling coil, a first heat transfer fluid flowing through the first cooling coil, a second heat transfer fluid flowing through the second cooling coil, a first heat exchanger in fluid communication with the second heat transfer fluid and a source of external air, and a system of fluid control devices in fluid communication with the second heat transfer fluid, the instructions instructing at least one processor to:
- operate the cooling system in a plurality of operating modes, wherein the plurality of operating modes control one or more operating parameters of the system of fluid control devices;
- operate the system of fluid control devices to minimize a change in a total pressure drop of the second heat transfer fluid when the cooling system switches between the plurality of operating modes; and
- operate the cooling system to minimize an absolute difference in a total pressure of the cooling system when the cooling system changes modes within the plurality of operating modes, the absolute difference in the total pressure of the cooling system being a difference in the operating pressure in one mode and operating pressure in another mode.

17. A non-transitory computer-readable medium containing thereon instructions for a cooling system including a cooling device having a first cooling coil, a second cooling coil, a first heat transfer fluid flowing through the first cooling coil, a second heat transfer fluid flowing through the second cooling coil, a first heat exchanger in fluid communication with the second heat transfer fluid and a source of external air, and a system of fluid control devices in fluid communication with the second heat transfer fluid, the instructions instructing at least one processor to:
- operate the cooling system in a plurality of operating modes, wherein the plurality of operating modes control one or more operating parameters of the system of fluid control devices;
- operate the system of fluid control devices to minimize a change in a total pressure drop of the second heat transfer fluid when the cooling system switches between the plurality of operating modes; and
- operate the system of fluid control devices to maintain at a fixed pump speed when the cooling system switches between operating modes, wherein a flow variation of the second heat transfer fluid varies by less than about 15% between the operating modes.

* * * * *